United States Patent
Yu et al.

(10) Patent No.: US 9,812,332 B2
(45) Date of Patent: Nov. 7, 2017

(54) ETCHING METHODS AND METHODS OF MANUFACTURING SEMICONDUCTOR DEVICES USING THE SAME

(71) Applicant: Samsung Electronics Co., Ltd., Suwon-si (KR)

(72) Inventors: Hyun-Kwan Yu, Suwon-si (KR); Woonki Shin, Seoul (KR); Moonhan Park, Yongin-si (KR); DongSuk Shin, Yongin-si (KR); HanJin Lim, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/398,776

(22) Filed: Jan. 5, 2017

(65) Prior Publication Data

US 2017/0194158 A1    Jul. 6, 2017

(30) Foreign Application Priority Data

Jan. 5, 2016 (KR) .................. 10-2016-0000996

(51) Int. Cl.
| | |
|---|---|
| *H01L 21/461* | (2006.01) |
| *H01L 21/306* | (2006.01) |
| *H01L 21/02* | (2006.01) |
| *H01L 21/8234* | (2006.01) |

(52) U.S. Cl.
CPC .. *H01L 21/30604* (2013.01); *H01L 21/02057* (2013.01); *H01L 21/823418* (2013.01); *H01L 21/823437* (2013.01); *H01L 21/823468* (2013.01); *H01L 21/823481* (2013.01)

(58) Field of Classification Search
None
See application file for complete search history.

(56) References Cited

U.S. PATENT DOCUMENTS

| | | | |
|---|---|---|---|
| 6,348,157 B1 | 2/2002 | Ohmi et al. | |
| 7,157,382 B2 | 1/2007 | Kudelka | |
| 8,679,925 B2 | 3/2014 | Wang | |
| 8,759,874 B1 | 6/2014 | Loubet et al. | |
| 8,877,592 B2 | 11/2014 | Tsai et al. | |
| 8,921,191 B2 | 12/2014 | Cai et al. | |
| 9,165,767 B2 | 10/2015 | Krishnan et al. | |
| 2014/0070328 A1 | 3/2014 | Goto et al. | |
| 2014/0183605 A1 | 7/2014 | Mochizuki et al. | |
| 2014/0225219 A1 | 8/2014 | Huang et al. | |
| 2015/0206939 A1 | 7/2015 | Huang et al. | |
| 2015/0221726 A1 | 8/2015 | Wong et al. | |
| 2016/0380082 A1 | 12/2016 | Yu et al. | |

FOREIGN PATENT DOCUMENTS

KR   10-2017-0001274   1/2017

*Primary Examiner* — Reema Patel
(74) *Attorney, Agent, or Firm* — Muir Patent Law, PLLC

(57) ABSTRACT

An etching method is disclosed. The etching method comprises providing on a substrate a structure comprising a recess region formed therein. The recess region includes an inner part and a mouth part whose width is less than that of the inner part. The etching method further comprises performing a clean-then-etch process to remove at least a portion of etching object formed outside the recess region. The performing a clean-then-etch process comprises performing a cleaning process to fill at least a portion of the recess region with a cleaning solution, and performing a wet etch process to the substrate in a state that the cleaning solution remains in the recess region.

20 Claims, 29 Drawing Sheets

ETCHING METHODS AND METHODS OF MANUFACTURING SEMICONDUCTOR DEVICES USING THE SAME

CROSS-REFERENCE TO RELATED APPLICATIONS

This U.S. non-provisional patent application claims priority under 35 U.S.C. §119 of Korean Patent Application 10-2016-0000996 filed on Jan. 5, 2016, the entire contents of which are hereby incorporated by reference.

BACKGROUND

The present disclosure relates to a method for manufacturing a semiconductor device using a wet etch process.

The semiconductor devices may include integrated circuits having MOSFETs. As sizes and design rules of the semiconductor devices are gradually decreased, sizes of the MOSFETs are also increasingly scaled down. The scale down of MOSFETs can induce short channel effects, whereby deteriorating operation characteristics of the semiconductor devices. Accordingly, various methods have been developed to obtain semiconductor devices having superior performances while overcoming limitations due to integration of the semiconductor devices.

SUMMARY

Embodiments of the present inventive concept provide an etching method capable of removing an etching object while preventing deformation of an underlying structure.

Embodiments of the present inventive concept provide a method for manufacturing a semiconductor device with improved reliability.

According to an exemplary embodiment of the present inventive concept, a method of manufacturing a semiconductor device may include: providing a first structure comprising a recess region on a substrate, the recess region including an inner part and a mouth part whose width is less than that of the inner part in a cross-sectional view; and performing a clean-then-etch process to remove at least a portion of etching object formed outside the recess region, the performing the clean-then-etch process comprising, performing a cleaning process filling at least a portion of the recess region with a cleaning solution, and performing a wet etch process to the substrate in a state that the cleaning solution remains in the recess region.

According to an exemplary embodiment of the present inventive concept, a method of manufacturing a semiconductor device may comprise: forming a device isolation layer defining first and second active patterns that extend parallel to each other in a first direction; forming a pair of sacrificial patterns crossing the first and second active patterns; forming first and second source/drain regions respectively in the first and second active patterns exposed between the sacrificial patterns; forming injection prevention spacers on sidewalls of the sacrificial patterns; and removing the injection prevention spacers using a clean-then-etch process. A recess region may be defined by a top surface of the device isolation layer, facing sidewalls of the sacrificial patterns and facing sidewalls of the first and second source/drain regions. The clean-then-etch process may comprise: performing a cleaning process filling at least a portion of the recess region with a cleaning solution; and performing a wet etch process to the substrate in a state that the cleaning solution remains in the recess region.

According to aspects of the disclosure, a method of manufacturing a semiconductor device comprises providing a substrate, forming first and second active patterns on the substrate, the first and second active patterns extending parallel to each other in a first direction, forming first and second gate structures on the substrate, the first and second gate structures extending parallel to each other in a second direction crossing the first direction, forming first and second source/drain regions on the respective first and second active patterns, and between the first and second gate structures, forming a first insulation layer on the substrate covering the first and second active patterns, the first and second gate structures, and the first and second source/drain regions, cleaning the substrate with a cleaning liquid, and etching the first insulation layer with an etching solution in a state that a portion of the cleaning liquid remains between the first and second source/drain regions.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain embodiments of the present invention. In the drawings:

FIGS. 6A through 15A are plan views illustrating a method for manufacturing a semiconductor device according to an exemplary embodiment of the present inventive concept;

FIGS. 6B through 15B are cross-sectional views taken along lines I-I', II-II' and III-III' of FIGS. 6A through 15A, respectively;

DETAILED DESCRIPTION

Figure 1A:
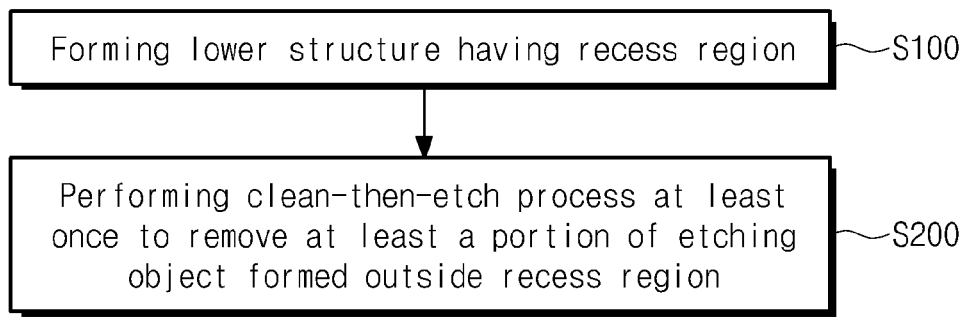
FIG. 1A is a flow chart illustrating an etching method according to an exemplary embodiment of the present inventive concept.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). [Alt: The term "contact," as used herein, refers to a direct connection (i.e., touching) unless the context indicates otherwise.]

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Hereinafter, aspects of exemplary embodiments of the present invention will be described in conjunction with the accompanying drawings.

Figure 1B:
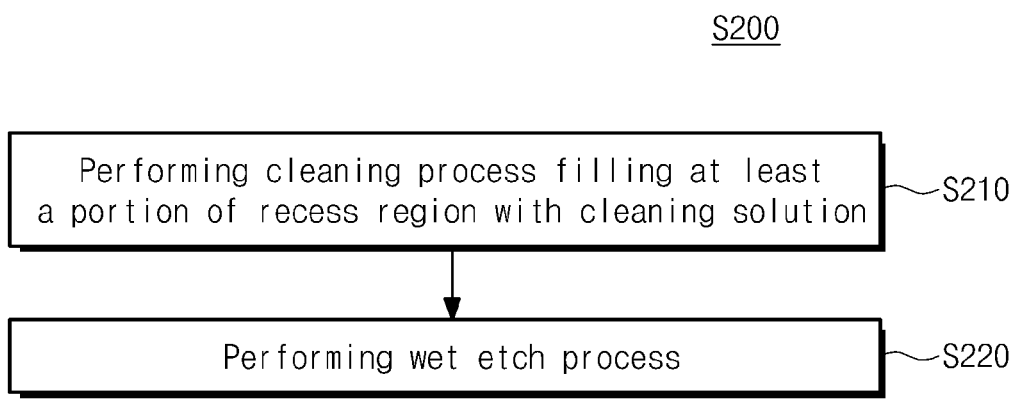
FIG. 1B is a flow chart illustrating a clean-then-etch process of FIG. 1A.

FIG. 1A is a flow chart illustrating an etching method according to an exemplary embodiment of the present inventive concept. FIG. 1B is a flow chart illustrating a clean-then-etch process of FIG. 1A. FIGS. 2A through 2E are cross-sectional views illustrating an etching method of FIG. 1A.

Figure 2A:
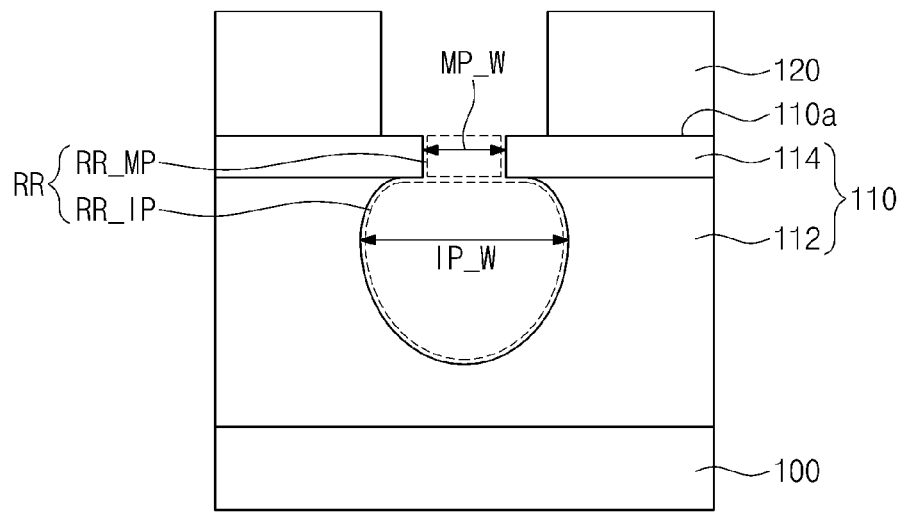
FIGS. 2A through 2E are cross-sectional views illustrating an etching method of FIG. 1A.

Referring to FIGS. 1A and 2A, a lower structure 110 may be formed on a substrate 100 (S100). The lower structure 110 may include a recess region RR formed under a surface 110a thereof.

The recess region RR may include a mouth part RR_MP and an inner part RR_IP. The mouth part RR_MP may be a portion of the recess region RR that is connected to the surface 110a of the lower structure 110, and the inner part RR_IP may be a portion of the recess region RR that is disposed under the mouth part RR_MP. A width MP_W of the mouth part RR_MP may be less than a width IP_W of the inner part RR_IP, as viewed in a cross-section.

In some embodiments, the lower structure 110 may include a first structure 112 and a second structure 114 on the first structure 112. The recess region RR may penetrate the second structure 114 and extend in/toward the first structure 112. The second structure 114 may include the mouth part RR_MP of the recess region RR, and the first structure 112 may include at least a portion of the inner part RR_IP of the recess region RR. The second structure 114 may include the surface 110a connected to the mouth part RR_MP of the recess region RR.

The first structure 112 and the second structure 114 may include different materials, and thus may have different physical/chemical properties. The first structure 112 may have a hydrophilic property higher than that of the second structure 114. With respect to an etching solution used in a wet etch process described later with reference to FIG. 2C, the first structure 112 may have an etch rate greater than that of the second structure 114. Similarly, an inner wall of the inner part RR_IP of the recess region RR may have a hydrophilic property higher than that of the surface 110a connected to the mouth part RR_MP of the recess region RR. With respect to an etching solution used in a wet etch process described later with reference to FIG. 2C, the inner wall of the inner part RR_IP of the recess region RR may have an etch rate greater than that of the surface 110a connected to the mouth part RR_MP of the recess region RR. For example, the first structure 112 may include, but is not limited to, at least one of silicon oxide, silicon nitride and silicon oxynitride. For example, the second structure 114 may include, but is not limited to, at least one of silicon, germanium, silicon-germanium and silicon-carbide.

For example, the lower structure 110 may be obtained by forming a preliminary first structure (not shown), forming the second structure 114 having an opening on the preliminary first structure, and wet etching a portion of the preliminary first structure exposed by the opening. Alternatively, the lower structure 110 may be attained by forming the first structure 112 having a recessed top surface and forming the second structure 114 with a narrow-width opening on the first structure 112. The formation of the first structure 112 should not however be construed as limited to the embodiments described above.

An etching object 120 may be formed on outside of the recess region RR. The etching object 120 may be a layer that is patterned and/or removed by an etching process. The etching object 120 may be an insulation layer or a conductive layer. The etching object 120 may be formed not to cover the mouth part RR_MP of the recess region RR. The etching object 120 may include a material different from that of the second structure 114, and thus may have a different physical/chemical property than the second structure 114. With respect to an etching solution used in a wet etch process described later with reference to FIG. 2C, the etching object 120 may have an etch rate greater than that of the second structure 114. For example, the etching object 120 may include, but is not limited to, at least one of silicon oxide, silicon nitride and silicon oxynitride. The etching object 120 may be formed by performing a deposition process and/or an etch process. For example, the deposition process may include a chemical vapor deposition (CVD), a physical vapor deposition (PVD), or an atomic layer deposition (ALD), and the etch process may include a dry etch process or a wet etch process. In some embodiments, the formation of the recess region RR may be followed by the formation of the etching object 120. However, embodiments are not limited thereto. In other embodiments, the formation of the recess region RR may be followed by the formation of the etching object 120.

Referring to FIGS. 1A, 1B, 2B and 2C, at least a portion of the etching object 120 may be etched/removed using a clean-then-etch process (S200). For example, a clean-then-etch process (S200) may include a cleaning step (S210) before an etching step (S220). For example, a clean-then-etch process (S200) may include an etching process of a substrate performed while a cleaning solution remains at least on a portion of the substrate.

Figure 2B:
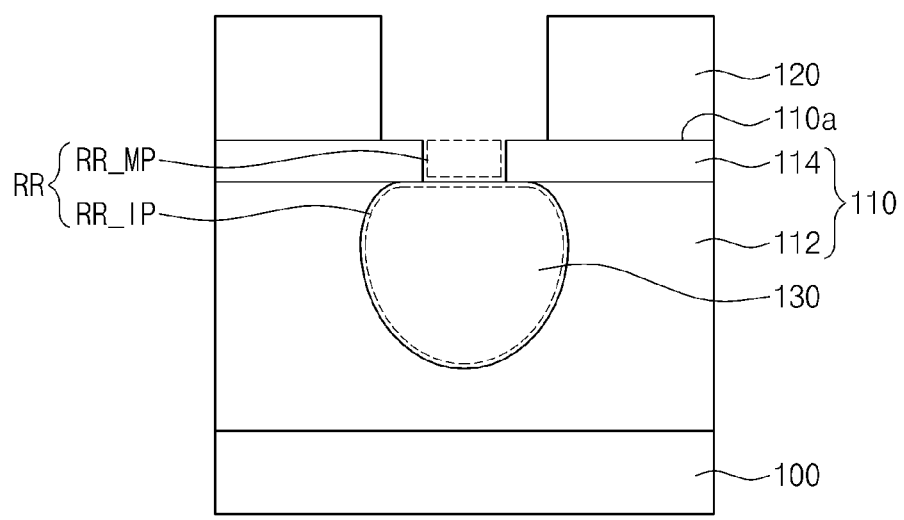

Referring to FIGS. 1A, 1B and 2B, a cleaning process may be performed (S210). The cleaning process may include providing a cleaning solution to an entire surface of the substrate 100 having the etching object 120 formed thereon. The cleaning solution may have a hydrophilic property and may not substantially etch the lower structure 110 and the etching object 120. For example, the cleaning solution may be a cleaning liquid. For example, the cleaning liquid may be deionized water. For example, the cleaning solution may be water ($H_2O$).

The recess region RR may be at least partially filled with the cleaning solution 130 employed in the cleaning process. After the cleaning process, the cleaning solution provided outside the recess region RR may be removed. For example, a spin dry process may be performed to remove the cleaning solution outside the recess region RR. Since the mouth part RR_MP may have the width MP_W narrower than the width IP_W of the inner part RR_IP, and/or the inner wall of the inner part RR_IP may have a higher hydrophilic property than that of the surface 110a of the lower structure 110 that is connected to the mouth part RR_MP as illustrated in FIG. 2A, the cleaning solution 130 may remain in the recess region RR. The cleaning process may be performed for a sufficiently long time to introduce the cleaning solution 130 into the recess region RR. For example, the cleaning process may be performed for a duration longer than the duration of a wet etch process described later with reference to FIG. 2C.

Figure 2C:
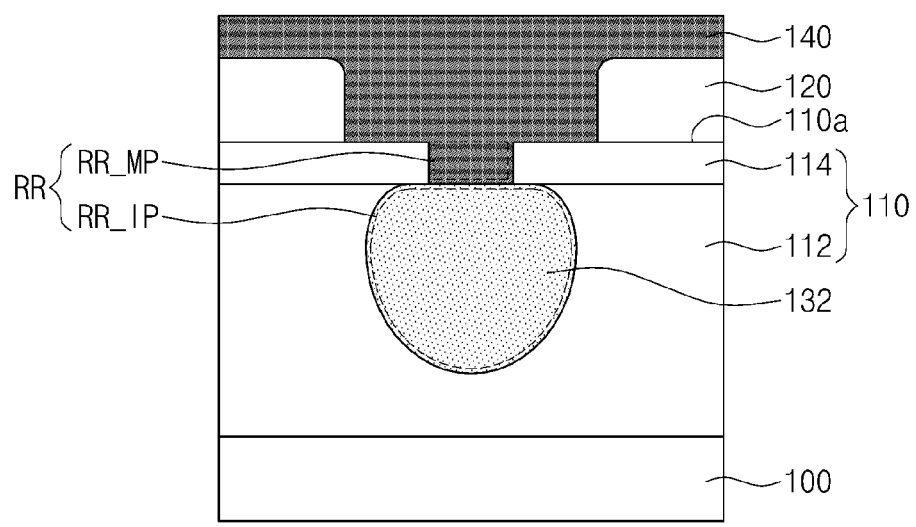

Referring to FIGS. 1A, 2B and 2C, a wet etch process may be performed to etch/remove at least a portion of the etching object 120 (S220). The wet etch process may include providing an etching solution 140 to an entire surface of the substrate 100 on which the lower structure 110 and the etching object 120 are formed. The etching solution 140 may exhibit a higher etch rate with respect to the etching object 120 than that of the second structure 114. The etching solution 140 may exhibit a higher etch rate with respect to the first structure 112 than that of the second structure 114. For example, the etching solution 140 may include hydrofluoric acid and/or phosphoric acid.

During the wet etch process, a portion of the etching solution 140 may be introduced into the recess region RR. The etching solution 140 introduced into the recess region RR may be diluted by the cleaning solution 130 remained in the recess region RR. For example, the diluted etching solution 132 in the recess region RR may have a concentration less than that of the etching solution 140 outside the recess region RR. The wet etch process may be performed for a duration shorter than that of the cleaning process described with reference to FIG. 2B.

The clean-then-etch process described above with reference to FIGS. 1B, 2B and 2C may be carried out at least once. Embodiments of clean-then-etch process executed a plurality of times will be described later with reference to FIGS. 3A and 3B.

Figure 2D:
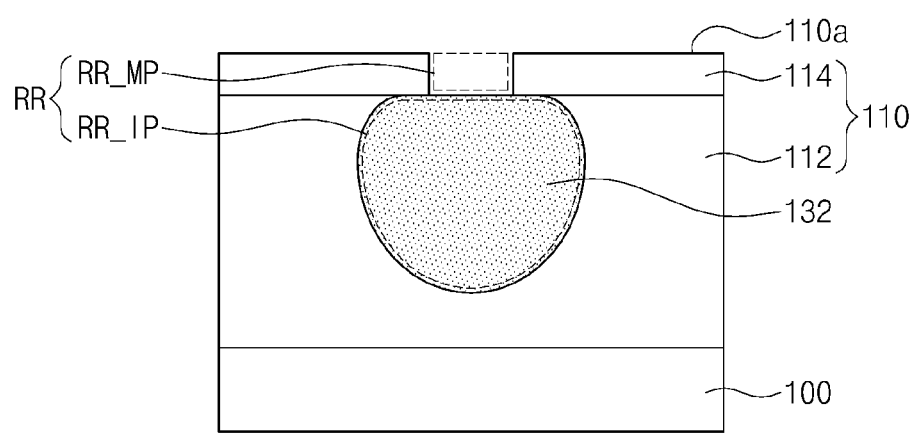

Referring to FIG. 2D, after the clean-then-etch process is performed at least once, the diluted etching solution 132 may be remained in the recess region RR. Since the mouth part RR_MP may have the width MP_W narrower than the width IP_W of the inner part RR_IP, and/or the inner wall of the inner part RR_IP may have a higher hydrophilic property than that of the surface 110a of the lower structure 110 that is connected to the mouth part RR_MP as illustrated above with respect to FIG. 2A, the diluted etching solution 132 may remain in the recess region RR even after at least one clean-then-etch process is completed. The inner wall of the inner part RR_IP of the recess region RR may be etched by the diluted etching solution 132 in the recess region RR, which may deform the first structure 112. The diluted etching solution 132 may have a concentration lower than that of the etching solution 140 provided during the wet etch process described with reference to FIG. 2C, and the etching degree of the inner wall of the inner part RR_IP of the recess region RR and the deformation of the first structure 112 may be insignificant.

Figure 2E:
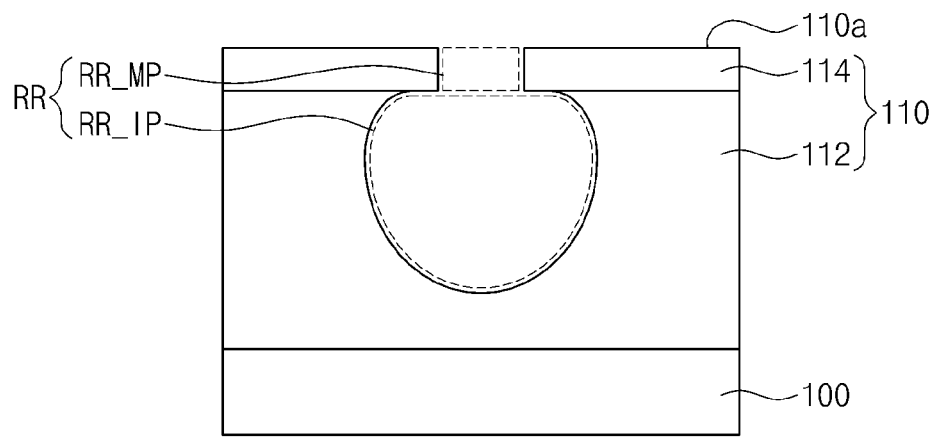

Referring to FIG. 2E, a heat treatment may be performed to remove the diluted etching solution 132 from the recess region RR.

According to embodiments of the inventive concepts, the clean-then-etch process may be executed to etch/remove the etching object 120 outside the recess region RR. According to the clean-then-etch process, the cleaning process may be performed prior to the wet etch process such that at least a portion of the recess region RR may be filled with the cleaning solution. For example, even though the etching solution may partially be introduced into the recess region RR in the following wet etch process, the etching solution 132 in the recess region RR may be diluted to have a concentration less than that of the etching solution 140 outside the recess region RR. For example, the wet etch process may etch/remove the etching object 120 outside the recess region RR while preventing or reducing etching and/or deforming of the inner part RR_IP of the recess region RR.

Figure 3A:
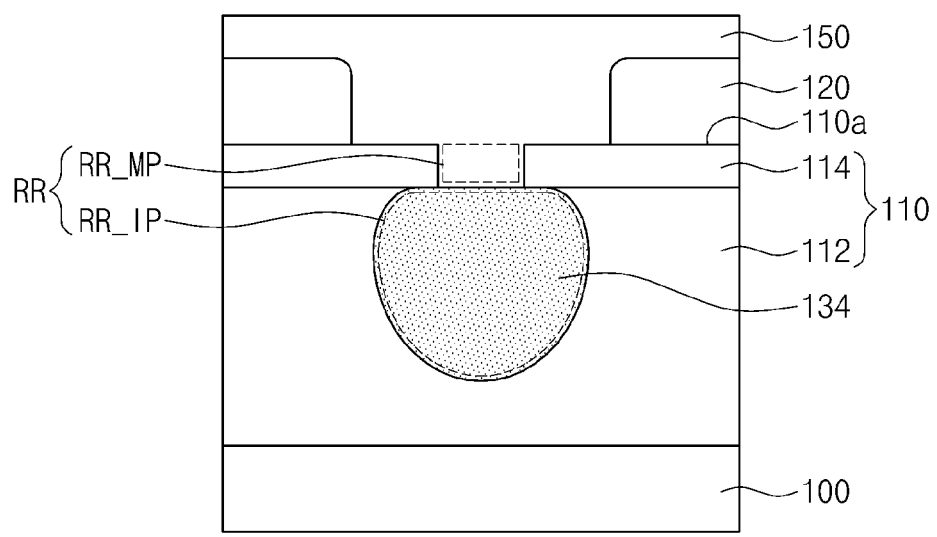
FIGS. 3A and 3B are cross-sectional views illustrating an etching method of FIG. 1A.
Figure 3B:
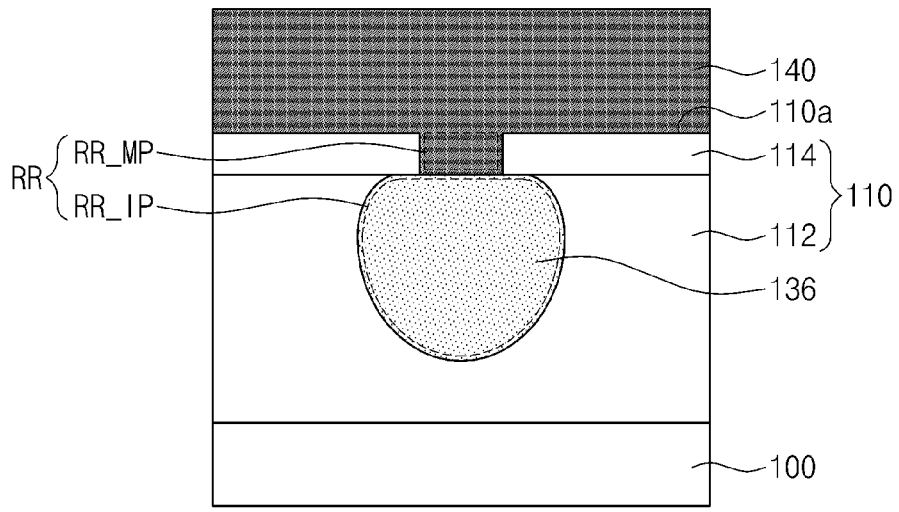

FIGS. 3A and 3B are cross-sectional views illustrating an etching method of FIG. 1A. FIGS. 3A and 3B shows further performing a clean-then-etch process after the clean-then-etch process described with referent to FIGS. 2A through 2C.

Referring to FIGS. 3A and 3B, the etching object 120 may remain after performing the clean-then-etch process described in FIGS. 2B and 2C, and a clean-then-etch process may be further performed on the remaining etching object 120.

Referring to FIGS. 1A, 1B and 3A, a cleaning process may be executed (S210). The cleaning process may include providing a cleaning solution 150 onto the entire surface of the substrate 100 on which the lower structure 110 and the etching object 120 are formed. The cleaning solution 150 may have a hydrophilic property. For example, the cleaning solution 150 may be water ($H_2O$).

A portion of the cleaning solution 150 may be introduced into the recess region RR during the cleaning process, and thus a concentration of an etching solution 134 in the recess region RR may be lowered. For example, the etching solution 134 may have a concentration lower than that of the etching solution 132 which has experienced the wet etch process described with reference to FIG. 2C. The cleaning process may be performed for a long time enough to introduce the cleaning solution 150 into the recess region RR. For example, the cleaning process may be performed for a duration longer than the duration of a wet etch process described later with reference to FIG. 3B.

Referring to FIGS. 1A, 1B and 3B, a wet etch process may be performed to etch/remove the etching object 120 (S220). The wet etch process may include providing the etching solution 140 to the entire surface of the substrate 100 on which the lower structure 110 and the etching object 120 are formed. The etching solution 140 may exhibit a higher etch rate with respect to the etching object 120 than the etch rate of the second structure 114. The etching solution 140 may exhibit a higher etch rate with respect to the first structure 112 than that of the second structure 114. For example, the etching solution 140 may include hydrofluoric acid and/or phosphoric acid.

During the wet etch process, a portion of the etching solution 140 may flow into the recess region RR such that concentration of the etching solution 136 in the recess region RR may be increased. For example, the etching solution 136 may have a concentration greater than that of the etching solution 134 which has experienced the cleaning process described in FIG. 3A. The concentration of the etching solution 136 in the recess region RR may still have a concentration less than the concentration of the etching solution 140 outside the recess region RR. The wet etch process may be performed for a duration shorter than that of the cleaning process described above with reference to FIG. 3A.

Subsequent processes may be substantially the same as to those described with reference to FIGS. 2D and 2E, and detailed descriptions thereof will therefore be omitted.

According to embodiments of the inventive concepts, the etching object 120 outside the recess region RR may be etched/removed using the repetition of the clean-then-etch process. According to the clean-then-etch process, the cleaning process may be performed prior to the wet etch process such that the recess region RR may be at least partially filled with the cleaning solution. Accordingly, although the recess region RR may receive a portion of the etching solution in the following wet etch process, the etching solution 132, 134 or 136 in the recess region RR may have a concentration less than that of the etching solution 140 outside the recess region RR. The cleaning process may be performed between the wet etch processes such that the concentration of the etching solution 132, 134 or 136 in the recess region RR may be prevented from increasing above a certain level. For example, the concentration of the solution 132, 134 and 136 may be less than 80% of the concentration of the etching solution 140. In certain embodiments, the concentration of the solution 132, 134, and 136 may be less than 50% of the concentration of the etching solution 140. For example, a concentration of a solution may refer to a weight percent of non-water constituents of the corresponding solution. Consequently, the wet etch process may etch/remove the etching object 120 outside the recess region RR while preventing or reducing etching and/or deforming of the inner part RR_IP of the recess region RR.

Figure 4:
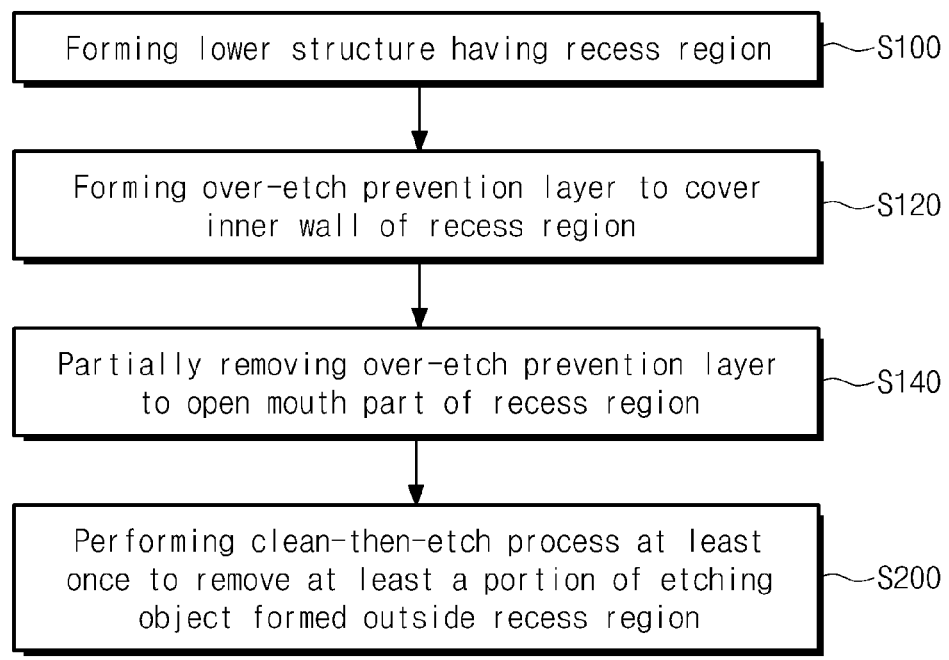
FIG. 4 is a flow chart illustrating an etching method according to exemplary embodiments of the present inventive concept.

FIG. 4 is a flow chart illustrating an etching method according to exemplary embodiments of the present inventive concept. FIGS. 5A through 5F are cross-sectional views illustrating an etching method of FIG. 4.

Figure 5A:
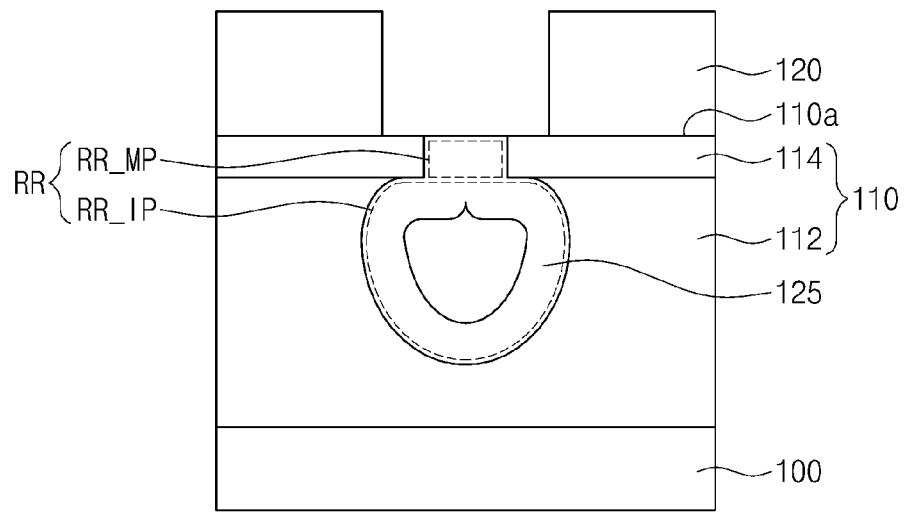
FIGS. 5A through 5F are cross-sectional views illustrating an etching method of FIG. 4.

Referring to FIGS. 4 and 5A, a lower structure 110 may be formed on a substrate 100. The lower structure 110 may include a recess region RR formed on a surface 110a thereof. An etching object 120 may be formed outside the recess region RR. The recess region RR, the lower structure 110, and the etching object 120 may be substantially the same as those described with reference to FIGS. 1A and 2A. For example, the recess region RR may include a mouth part RR_MP connected to a surface 110a of the lower structure 110 and a hollow inner part RR_IP under the mouth part RR_MP. The lower structure 110 may include a first structure 112 having the inner part RR_IP of the recess region RR formed therein and a second structure 114 having the mouth part RR_MP of the recess region formed therethrough. The etching object 120 may be formed on the lower structure 110 and may not cover the mouth part RR_MP of the recess region RR.

An over-etch prevention layer 125 may be formed to conformally cover an inner wall of the recess region RR (S120). In some embodiments, as illustrated in FIG. 5A, the over-etch prevention layer 125 may be formed to close a mouth part RR_MP of the recess region RR. The over-etch prevention layer 125 may be formed by a deposition process and/or an etch process. For example, the deposition process may be a chemical vapor deposition (CVD), a physical vapor deposition (PVD), or an atomic layer deposition (ALD), and the etch process may be a dry etch process or a wet etch process.

In some embodiments, the over-etch prevention layer 125 may be accompanied by forming the etching object 120. In such embodiments, the over-etch prevention layer 125 may include a material substantially identical to that of the etching object 120, and/or may have a physical/chemical property substantially the same as that of the etching object 120. With respect to an etching solution used in a wet etch process described later with reference to FIGS. 5C and 5E, the over-etch prevention layer 125 may have an etch rate greater than that of the second structure 114, and/or may have a hydrophilic property higher than that of the second structure 114. The over-etch prevention layer 125 may include at least one of, for example, silicon oxide, silicon nitride and silicon oxynitride.

Figure 5B:
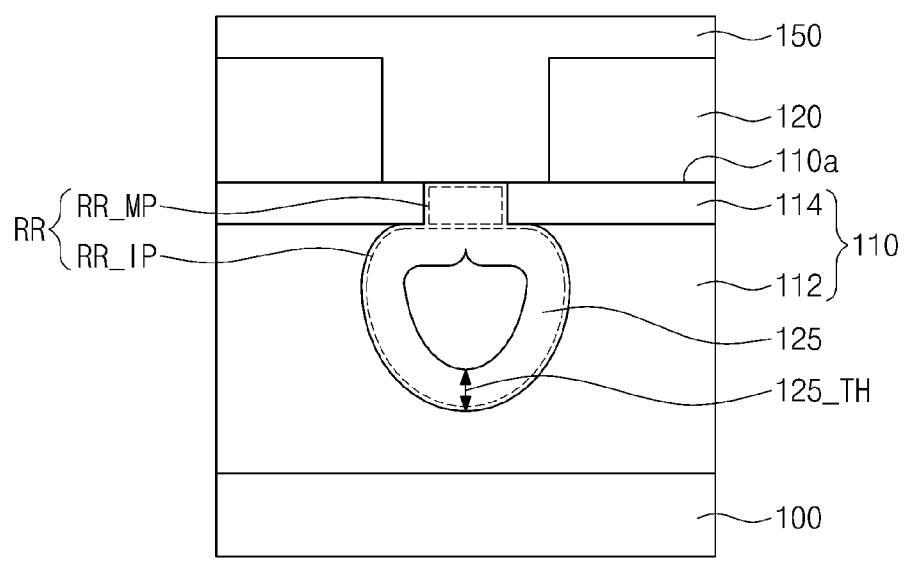
Figure 5C:
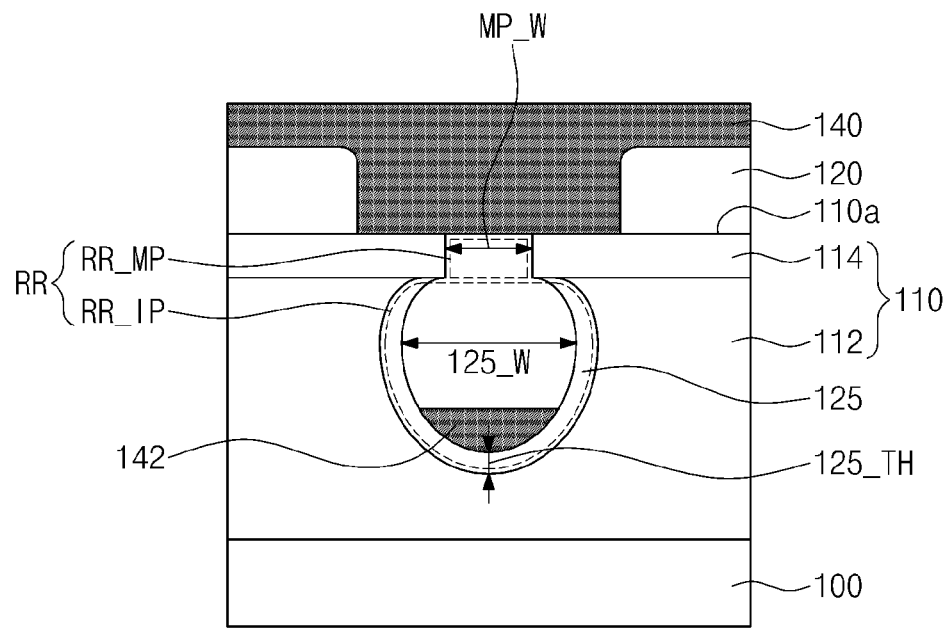

Referring to FIGS. 4, 5B and 5C, the over-etch prevention layer 125 may be partially etched/removed to open the mouth part RR_MP of the recess region RR (S140). The partial removal of the over-etch prevention layer 125 may be obtained by a process substantially identical or similar to the clean-then-etch process described with reference to FIGS. 1B, 2B and 2C.

Referring to FIGS. 4 and 5B, a cleaning process may be performed. The cleaning process may include providing a cleaning solution 150 onto an entire surface of the substrate 100 inclusive of the lower structure 110, the etching object 120 and the over-etch prevention layer 125.

The cleaning process may be executed to introduce the cleaning solution 150 into the recess region RR in case that the over-etch prevention layer 125 may not block up the mouth part RR_MP of the recess region RR or in case that it is uncertain whether the mouth part RR_MP of the recess region RR is blocked up. For example, the cleaning process may be performed when the over-etch layer 125 may block the mouth part RR_MP partially. When the mouth part RR_MP of the recess region RR is obviously closed, the cleaning process may be skipped. For example, when all of mouth parts RR_MP of the recess regions RR throughout the substrate 100 are closed, the cleaning process may be skipped.

Referring to FIGS. 4 and 5C, a wet etch process may be performed to etch/remove a portion of the over-etch prevention layer 125 that blocks up the mouth part RR_MP of the recess region RR. The wet etch process may include providing an etching solution 140 onto the entire surface of the substrate 110 on which the lower structure 110, the etching object 120, and the over-etch prevention layer 125 are formed. The etching solution 140 may exhibit higher etch rates with respect to the etching object 120 and the over-etch prevention layer 125 than that of the second structure 114. For example, the etching solution 140 may include hydrofluoric acid and/or phosphoric acid.

The portion of the over-etch prevention layer 125 that blocks up the mouth part RR_MP of the recess region RR may be etched/removed such that the mouth part RR_MP of the recess region RR may be opened and a portion 142 of the etching solution 140 may be introduced into the recess region RR. The etching solution 142 introduced into the recess region RR may etch the over-etch prevention layer 125 on the inner wall of the recess region RR. Accordingly, a thickness 125_TH of the over-etch prevention layer 125 may become thinner. For example, the over-etch prevention layer 125 on the inner surface of the recess region RR may be partially etched during this etching process. A width MP_W of the mouth part RR_MP may be less than a width 125_W between opposing sidewalls of the over-etch prevention layer 125 on the inner wall of the recess region RR as shown in a cross-sectional view of FIG. 5C. The wet etch process may be carried out for a sufficiently short duration so that an amount of the etching solution 142 introduced into the recess region RR may be less than a predetermined amount or minimized. For example, the wet etch process may be performed for a duration shorter than that of the cleaning process described formerly with reference to FIG. 5B and/or a following cleaning process described later with reference to FIG. 5D.

The etching object 120 may be partially etched/removed by the etching solution 140 outside the recess region RR during the wet etch process.

Referring to FIGS. 4, 1B, 5D and 5E, the etching object 120 may be at least partially etched/removed by using a clean-then-etch process (S200). The clean-then-etch process may be substantially the same as the clean-then-etch process described with reference to FIGS. 1B, 2B and 2C.

Figure 5D:
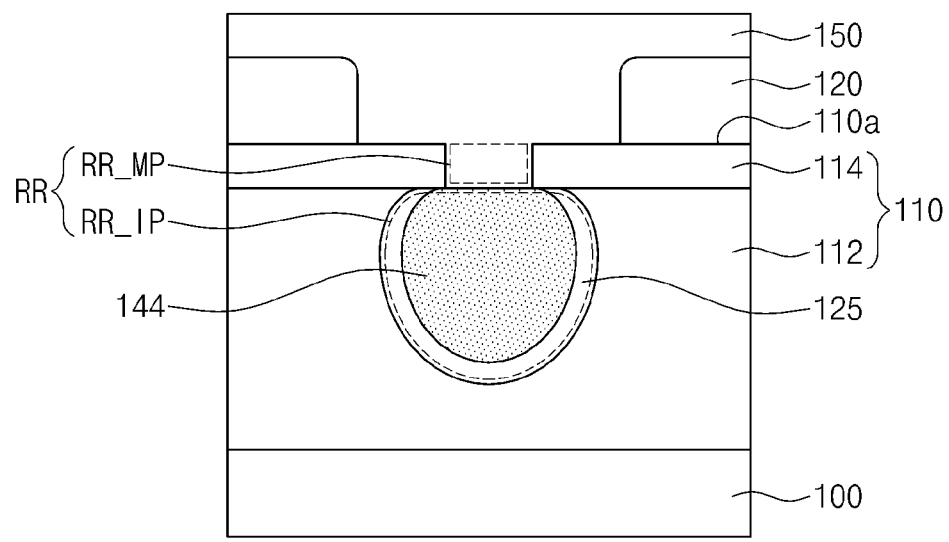

Referring to FIGS. 4, 1B and 5D, a cleaning process may be performed (S210). The cleaning process may include providing the cleaning solution 150 onto the entire surface of the substrate 100 on which the lower structure 110 and the etching object 120 are formed. The cleaning solution 150 may have a hydrophilic property and may not substantially etch the lower structure 110 and the etching object 120. For example, the cleaning solution 150 may be water ($H_2O$).

During the cleaning process, a portion of the cleaning solution 150 may be introduced into the recess region RR.

The cleaning solution 150 introduced into the recess region RR may dilute the etching solution 142 remained in the recess region RR. For example, after performing the cleaning process, an etching solution 144 remained in the recess region RR may have a concentration less than those of the etching solutions 140 and 142 provided in the wet etch process of FIG. 5C. For example, after performing the cleaning process, the etching solution 144 remained in the recess region RR may have a concentration less than that of the etching solution 140 which will be provided in the following wet etch process described later with reference to FIG. 5E.

After the cleaning process, the cleaning solution 150 outside the recess region RR may be removed. For example, a spin dry process may be performed to remove the cleaning solution 150 outside the recess region RR. Since the mouth part RR_MP may have the width MP_W narrower than the width 125_W between the opposing sidewalls of the over-etch prevention layer 125 on the inner part RR_IP as illustrated in FIG. 5C, and/or the over-etch prevention layer 125 may have a higher hydrophilic property than that of the second structure 114, an etching solution 144 may remain in the recess region RR. The cleaning process may be carried out for a sufficiently long time to introduce the cleaning solution 150 into the recess region RR. For example, the cleaning process may be performed for a duration longer than the duration of the wet etch process described formerly with reference to FIG. 5C and/or a wet etch process described later with reference to FIG. 5E.

Figure 5E:
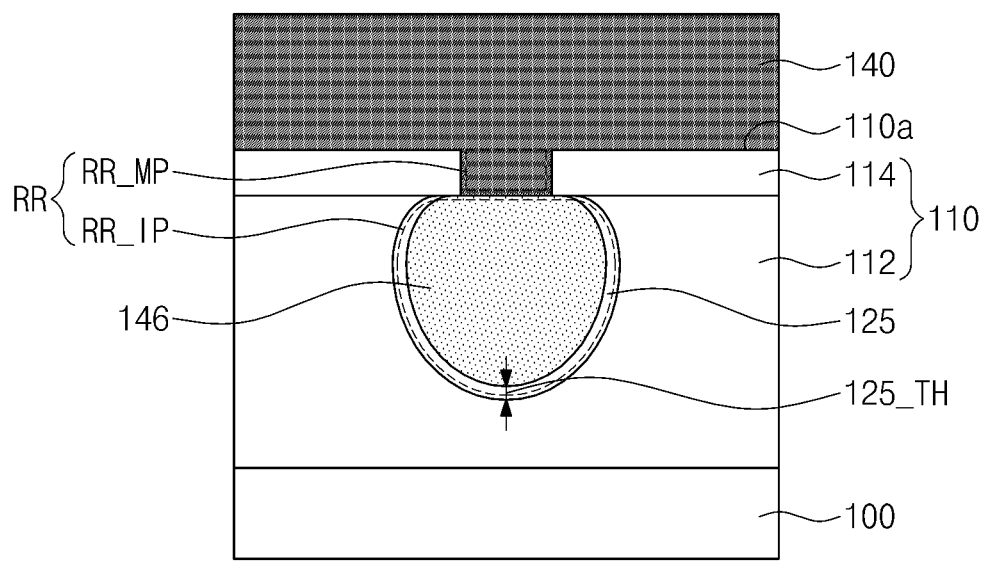

Referring to FIGS. 4, 1B and 5E, a wet etch process may be performed to etch/remove the etching object 120 (S220). The wet etch process may include providing the etching solution 140 to the entire surface of the substrate 100 on which the lower structure 110 and the etching object 120 are formed. The etching solution 140 may exhibit a higher etch rate with respect to the etching object 120 than that of the second structure 114. The etching solution 140 may exhibit a higher etch rate with respect to the first structure 112 and the over-etch prevention layer 125 than that of the second structure 114. For example, the etching solution 140 may include hydrofluoric acid and/or phosphoric acid.

During the wet etch process, a portion of the etching solution 140 may be introduced into the recess region RR. The etching solution 140 introduced into the recess region RR may be diluted by the cleaning solution 144 remained in the recess region RR. The diluted etching solution 146 in the recess region RR may have a concentration less than that of the etching solution 140 outside the recess region RR. The wet etch process may be performed for a duration shorter than that of the cleaning process described with reference to FIG. 5D. The over-etch prevention layer 125 may be etched by the diluted etching solution 146 in the recess region RR.

In some embodiments, as illustrated in FIG. 5E, the over-etch prevention layer 125 may remain on the inner part RR_IP of the recess region RR with a thickness 125_TH less than the thickness 125_TH of FIG. 5C. Inasmuch as the diluted etching solution 146 in the recess region RR may have a concentration less than that of the etching solution 140 provided outside the recess region RR during the wet etch process described with reference to FIGS. 5C and 5E, the over-etch prevention layer 125 may still remain in the recess region RR. In this case, the inner wall of the inner part RR_IP of the recess region RR may not be etched and the first structure 112 may not be deformed.

In some embodiments, unlike FIG. 5E, the over-etch prevention layer 125 may be removed by the diluted etching solution 146. In this case, the inner wall of the inner part RR_IP of the recess region RR may be etched and thus the first structure 112 may be deformed. However, since the diluted etching solution 146 in the recess region RR may have a concentration less than that of the etching solution 140 provided outside the recess region RR, the etching degree of the inner wall of the inner part RR_IP of the recess region RR and the deformation of the first structure 112 may be insignificant.

Figure 5F:
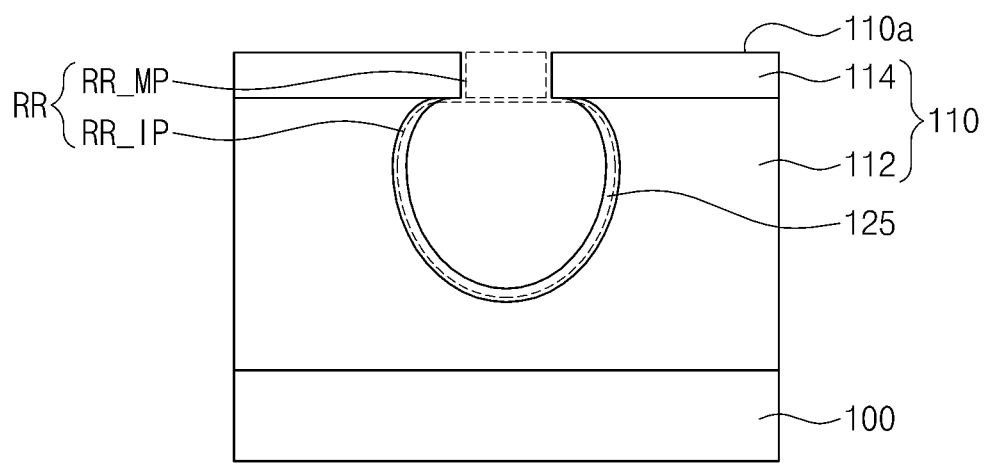

Referring to FIG. 5F, a heat treatment may be performed to remove the diluted etching solution 146 from the recess region RR.

In some embodiments, the cleaning process may be performed in advance of the wet etch process for etching the over-etch prevention layer 125. As a result, in case that the over-etch prevention layer 125 may not block up the mouth part RR_MP of the recess region RR, it may be possible to prevent or reduce etching and/or deforming of the inner part RR_IP of the recess region RR caused by the etching solution 140 provided in the wet etch process.

In some embodiments, the clean-then-etch process may be executed to etch/remove the etching object 120 outside the recess region RR. According to the clean-then-etch process, the cleaning process may be performed prior to the wet etch process such that the cleaning solution 150 may be introduced into the recess region RR. Accordingly, even though the etching solution 140 may partially be introduced into the recess region RR in the following wet etch process, the etching solution 146 in the recess region RR may have a concentration less than that of the etching solution 140 outside the recess region RR. Consequently, the wet etch process may etch/remove the etching object 120 outside the recess region RR while preventing or reducing etching and/or deforming of the inner part RR_IP of the recess region RR.

FIGS. 6A through 15A are plan views illustrating a method for manufacturing a semiconductor device according to an exemplary embodiment of the present inventive concept. FIGS. 6B through 15B are cross-sectional views taken along lines I-I', II-II' and III-III' of FIGS. 6A through 15A, respectively. FIG. 8C is an enlarged cross-sectional view of "A" of FIG. 8B.

Figure 6A:
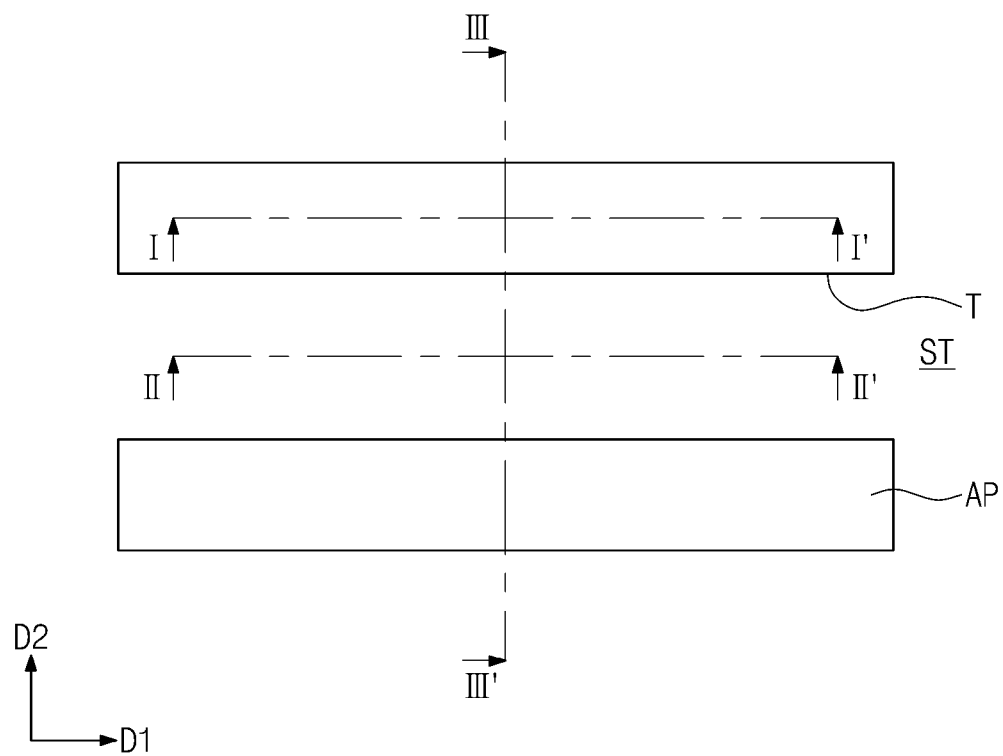
Figure 6B:
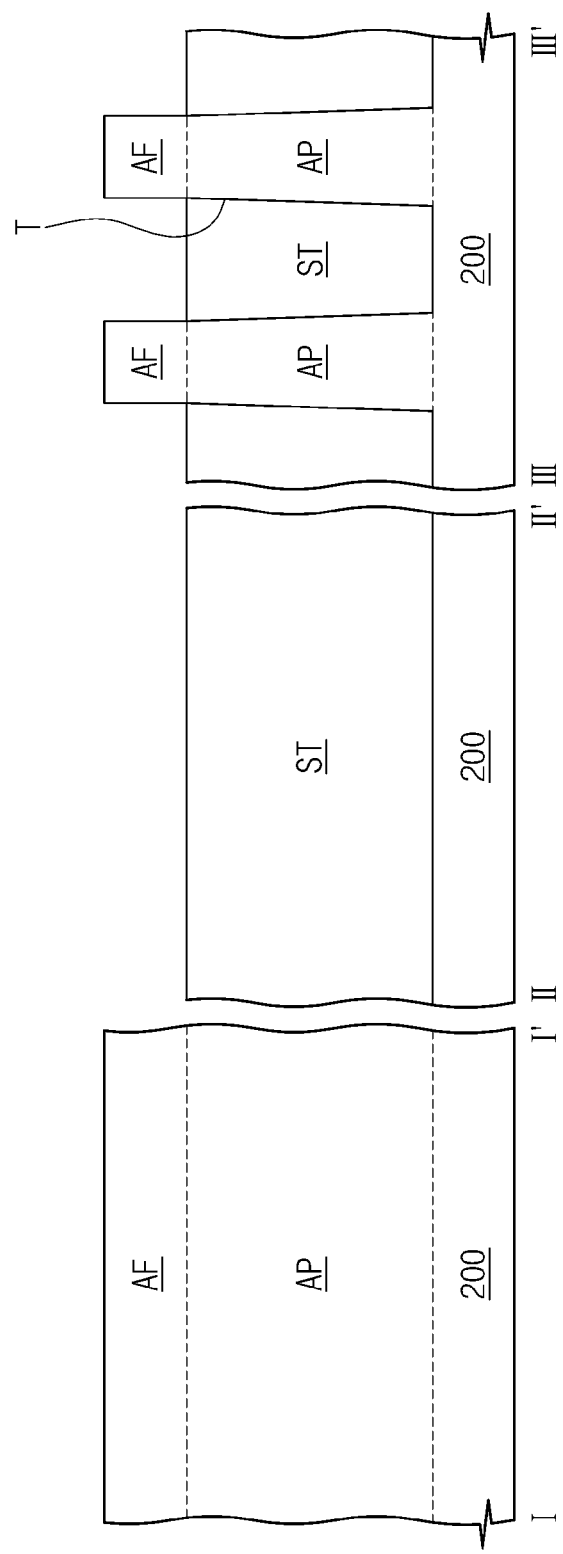

Referring to FIGS. 6A and 6B, a substrate 200 may be provided. The substrate 200 may be, for example, a silicon substrate, a germanium substrate, a SOI (Silicon On Insulator) substrate, or a GOI (Germanium On Insulator) substrate.

Trenches T may be formed on the substrate 200. The trenches T may extend along a first direction D1. The trenches T may define active patterns AP extending along the first direction D1. Each of the active patterns AP may be defined by a pair of adjacent trenches T extending in parallel. The active patterns AP may be spaced apart from each other along a second direction D2 crossing (e.g., perpendicular to) the first direction D1. At least one of the first direction D1 and the second direction D2 may be substantially parallel to the substrate 200.

A device isolation layer ST may be formed to fill the trenches T. The formation of the device isolation layer ST may include filling the trenches T with insulation layers (e.g., silicon oxide layers), and planarizing and etching the insulation layers to expose upper portions of the active patterns AP. The exposed upper portion of the active patterns AP may be active fins AF.

Figure 7A:
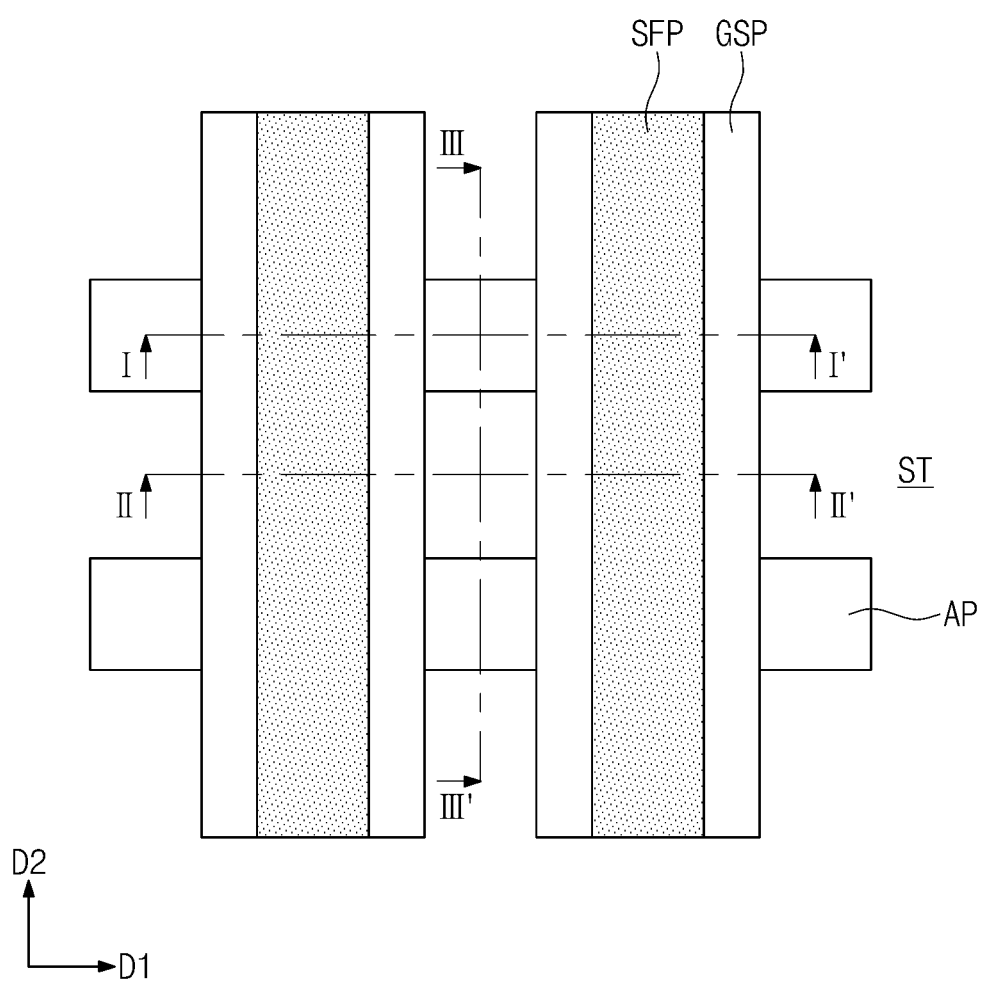
Figure 7B:
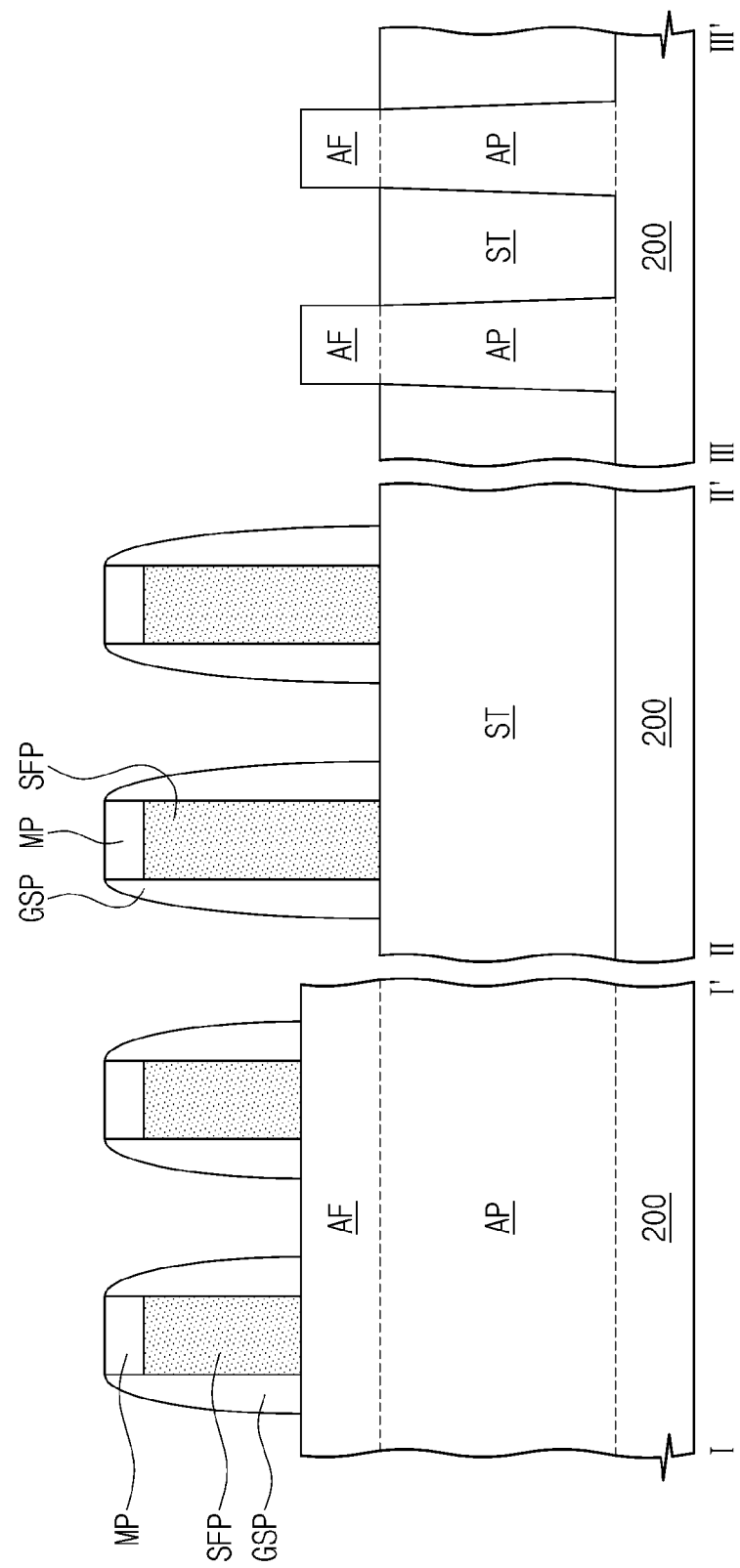

Referring to FIGS. 7A and 7B, sacrificial patterns SFP may be formed to cross the active fins AF. The sacrificial patterns SFP may extend, for example, along the second direction D2 and may be spaced apart from each other along the first direction D1. The formation of the sacrificial patterns SFP may include forming a sacrificial layer (not shown) to cover an entire surface of the substrate 200, forming mask patterns MP on the sacrificial layer, and patterning the sacrificial layer using the mask patterns MP as etch masks. The sacrificial patterns SFP may include, for example, polysilicon. The mask patterns MP may include, for example, silicon nitride and/or silicon oxynitride.

Gate spacers GSP may be formed on sidewalls of the sacrificial patterns SFP. The formation of the gate spacers GSP may include forming a gate spacer layer (not shown) to conformally cover the entire surface of the substrate 200 and anisotropically etching the gate spacer layer. The gate spacers GSP may include, for example, silicon oxide, silicon nitride, silicon oxynitride, silicon carbon nitride (SiCN), and/or silicon carbon oxynitride (SiCON).

Figure 8A:
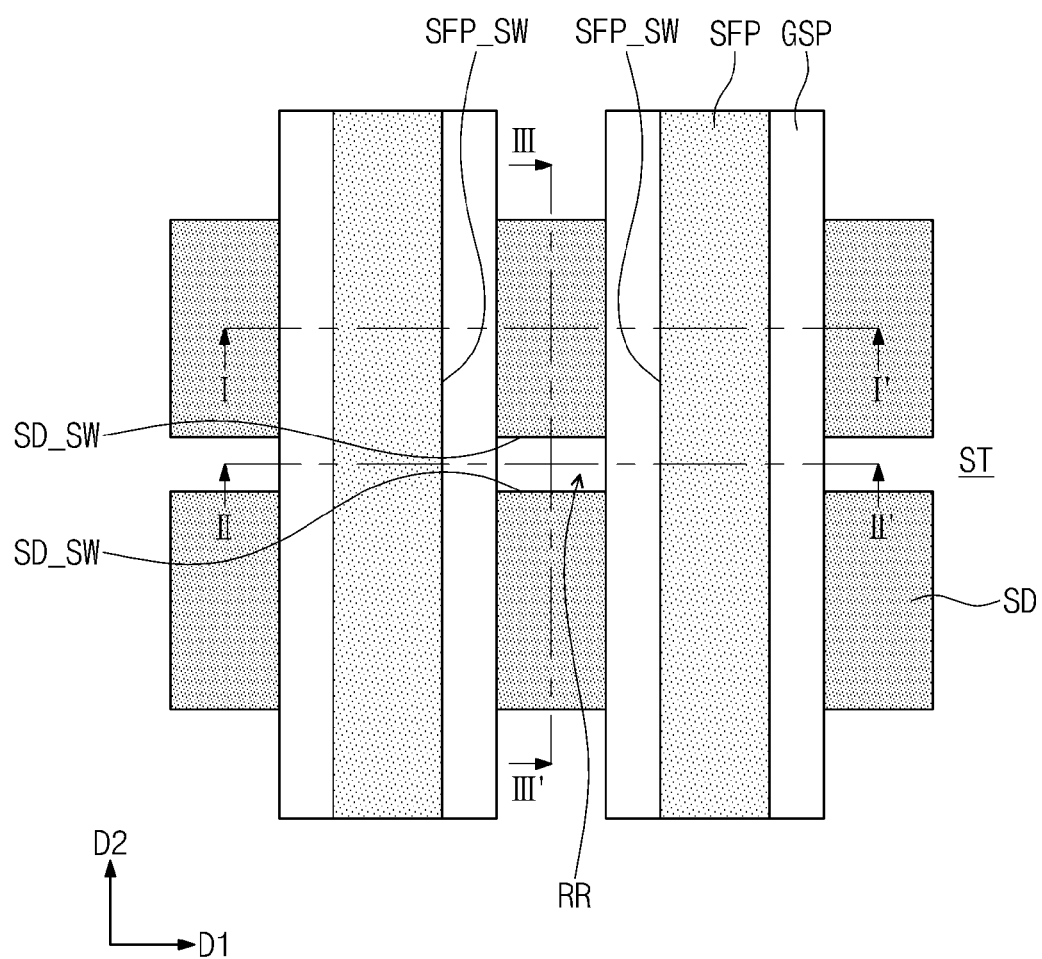
Figure 8B:
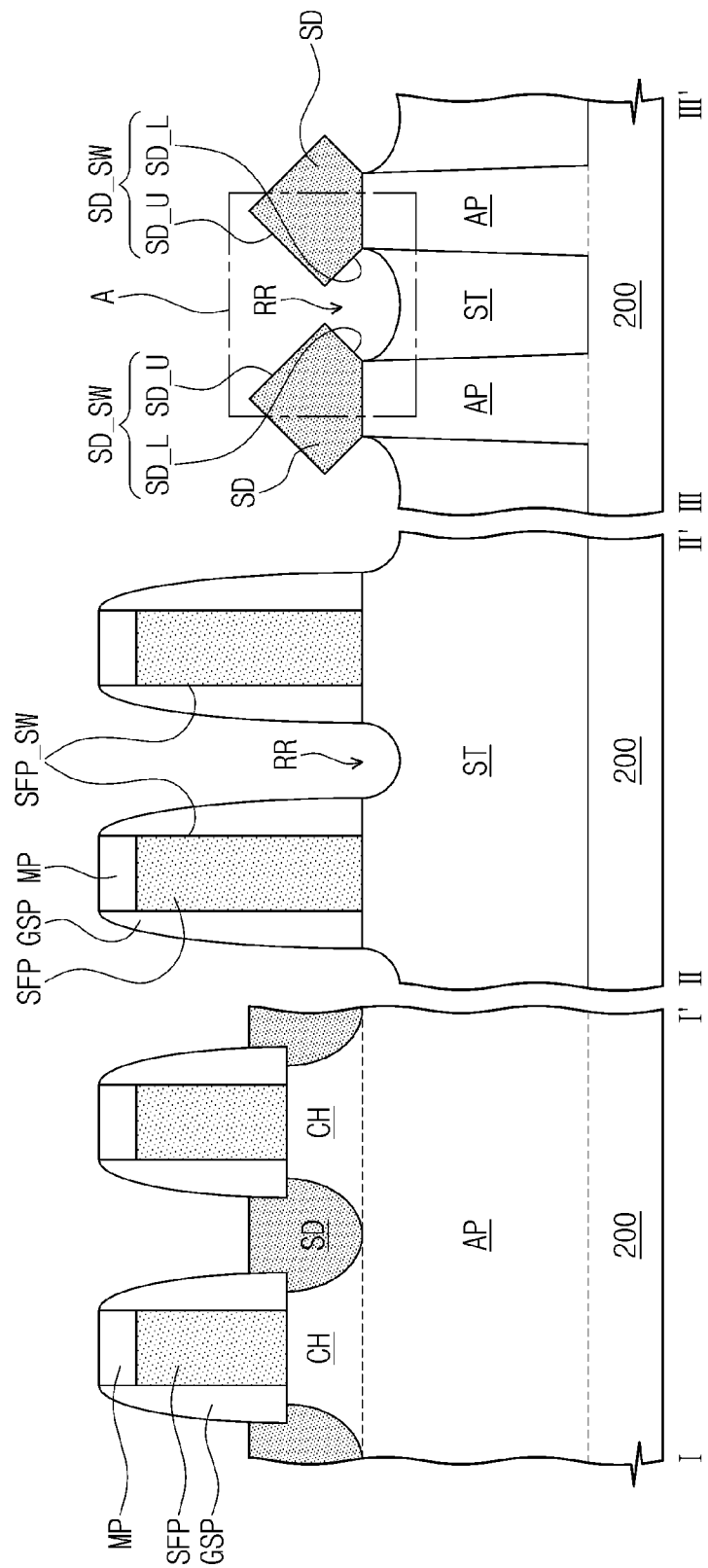
Figure 8C:
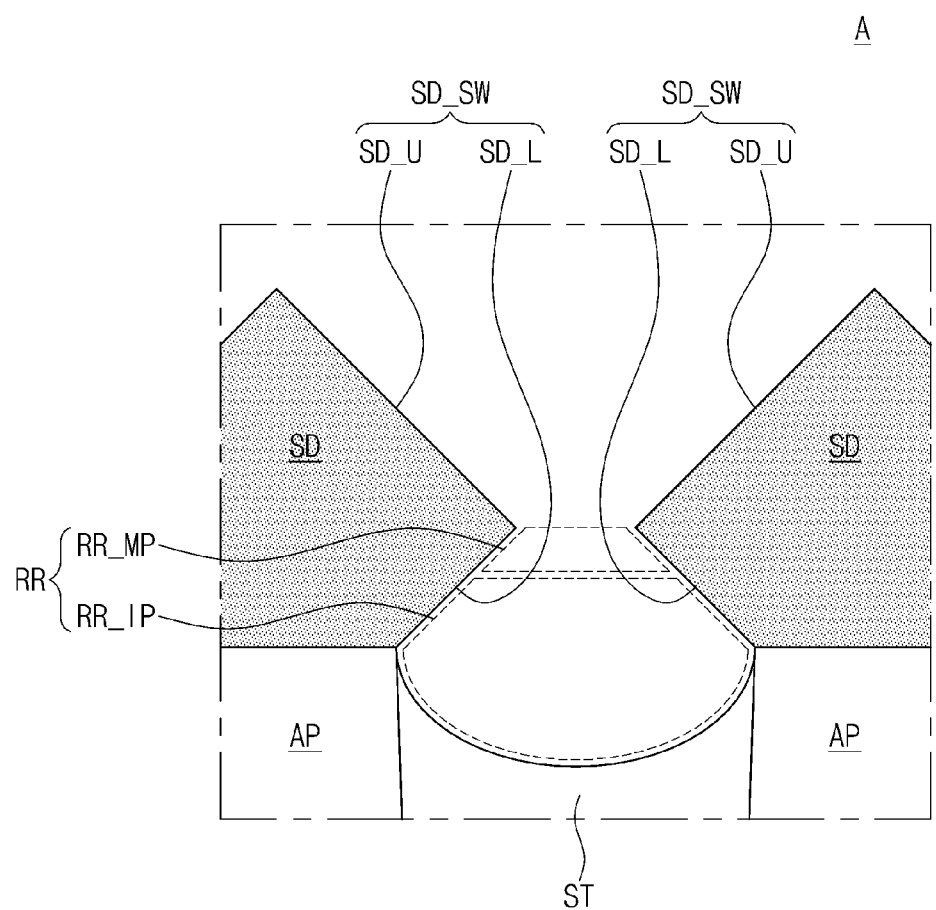
FIG. 8C is an enlarged cross-sectional view of "A" of FIG. 8B.

Referring to FIGS. 8A, 8B and 8C, source/drain regions SD may be formed in upper portions of the active patterns AP at both sides of each of the sacrificial patterns SFP. The formation of the source/drain regions SD may include etching the upper portions (i.e., the active fins AF) of the active patterns AP using the mask patterns MP and the gate spacers GSP as etch masks, and performing a selective epitaxial growth process using the etched active patterns AP as seed layers. The process for etching the upper portions of the active patterns AP may be performed to partially etch the device isolation layer ST which is exposed by the sacrificial patterns SFP and the gate spacers GSP. For example, the partially etched device isolation layer ST may have a concave top surface.

According to the formation of the source/drain regions SD, channel regions CH may be defined between the source/drain regions SD. The source/drain regions SD may include a semiconductor element whose lattice constant is different from that of the substrate 200, and thus may exert compressive or tensile strain on the channel regions CH. For example, the substrate 200 may be a silicon substrate, and the source/drain regions SD may include silicon-germanium or germanium. In this case, the compressive strain may be exerted on the channel regions CH. Alternatively, the substrate 200 may be a silicon substrate, and the source/drain regions SD may include silicon carbide (SiC). In this case, the tensile strain may be exerted on the channel regions CH.

The source/drain regions SD may include sloped sidewalls as viewed in cross-section. For example, a pair of source/drain regions SD adjacent to each other in the second direction D2 may include a pair of sidewalls SD_SW facing each other. The pair of sidewalls SD_SW may include a pair of lower sidewalls SD_L that are inclined so as to approach with increasing distance from the substrate 200 and a pair of upper sidewalls SD_U that are inclined away from each other with increasing distance from the substrate 200.

A recess region RR may be defined by the device isolation layer ST, a pair of sacrificial patterns SFP adjacent to each other in the first direction D1, and a pair of source/drain regions SD adjacent to each other in the second direction D2. As viewed in plan, the recess region RR may be an area surrounded by the pair of sacrificial patterns SFP adjacent to each other in the first direction D1 and the pair of source/drain regions SD adjacent to each other in the second direction D2. For example, the recess region RR may be defined by a top surface of the device isolation layer ST, facing sidewalls SFP_SW of a pair of sacrificial patterns SFP adjacent to each other in the first direction D1 (or facing sidewalls of a pair of gate spacers GSP on the sidewalls SFP_SW of the pair of sacrificial patterns SFP), and facing sidewalls SD_SW (e.g., the facing lower sidewalls SD_L) of the pair of source/drain regions SD adjacent to each other in the second direction D2. A mouth part RR_MP of the recess region RR may be defined by the facing lower sidewalls SD_L of the pair of source/drain regions SD adjacent to each other in the second direction D2. Accordingly, the recess region RR may include the mouth part RR_MP whose width is less than that of an inner part RR_IP.

Figure 9A:
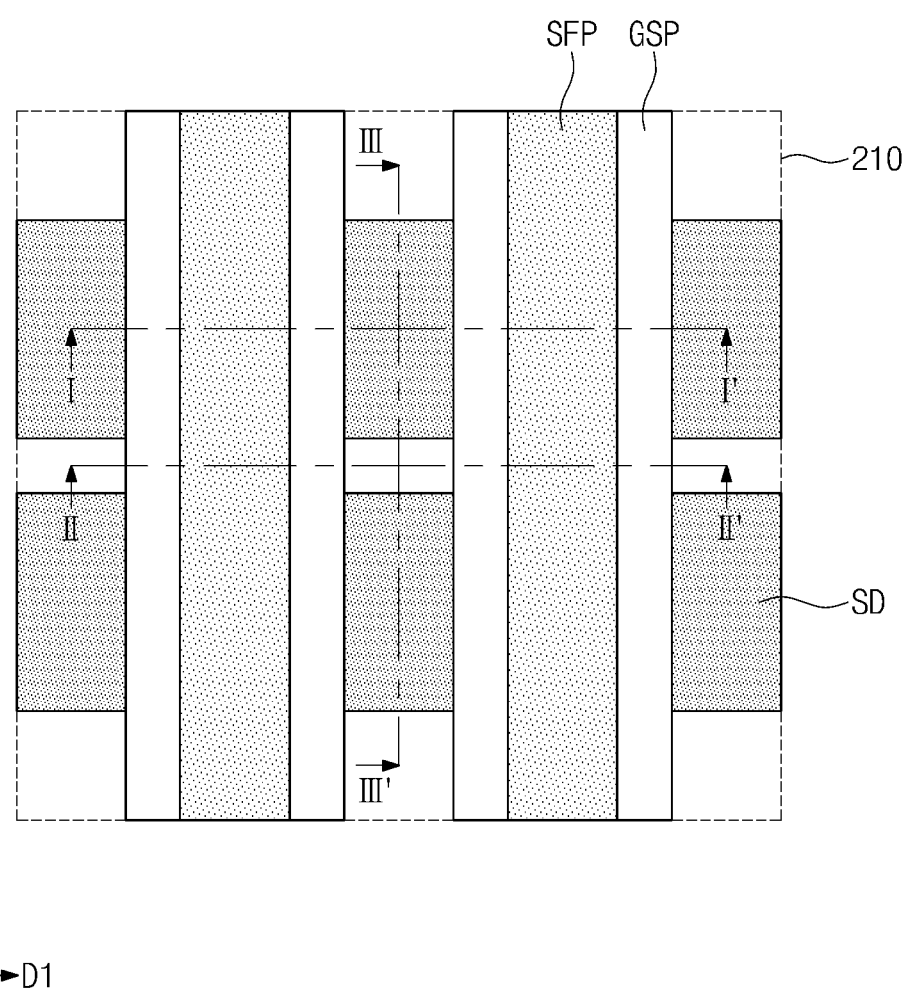
Figure 9B:
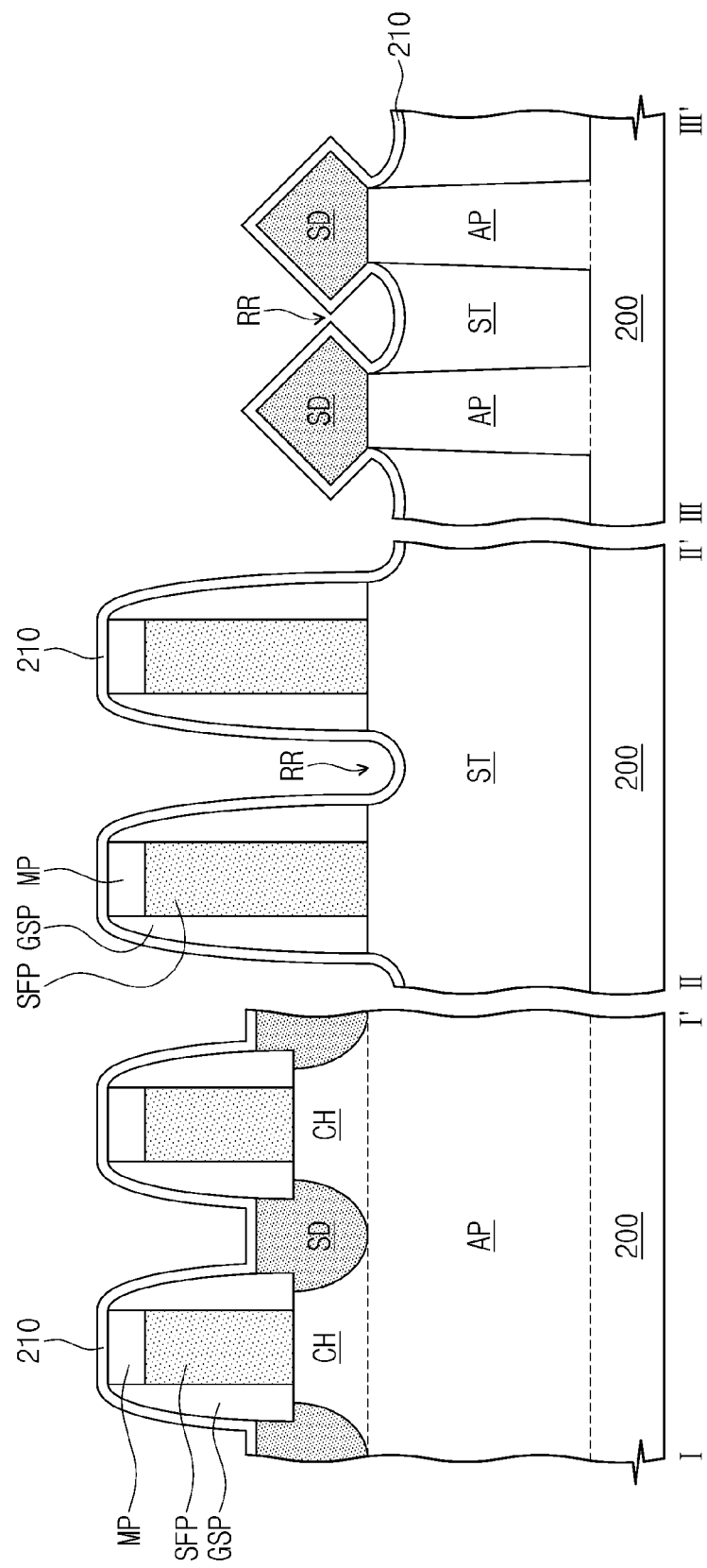

Referring to FIGS. 9A and 9B, an injection prevention layer 210 may be formed to conformally cover an entire surface of the substrate 200. The injection prevention layer 210 may include, for example, silicon oxide. For example, the injection prevention layer 210 may be an insulation layer. The injection prevention layer 210 may be formed by, for example, a chemical vapor deposition (CVD) process or an atomic layer deposition (ALD) process.

Figure 10A:
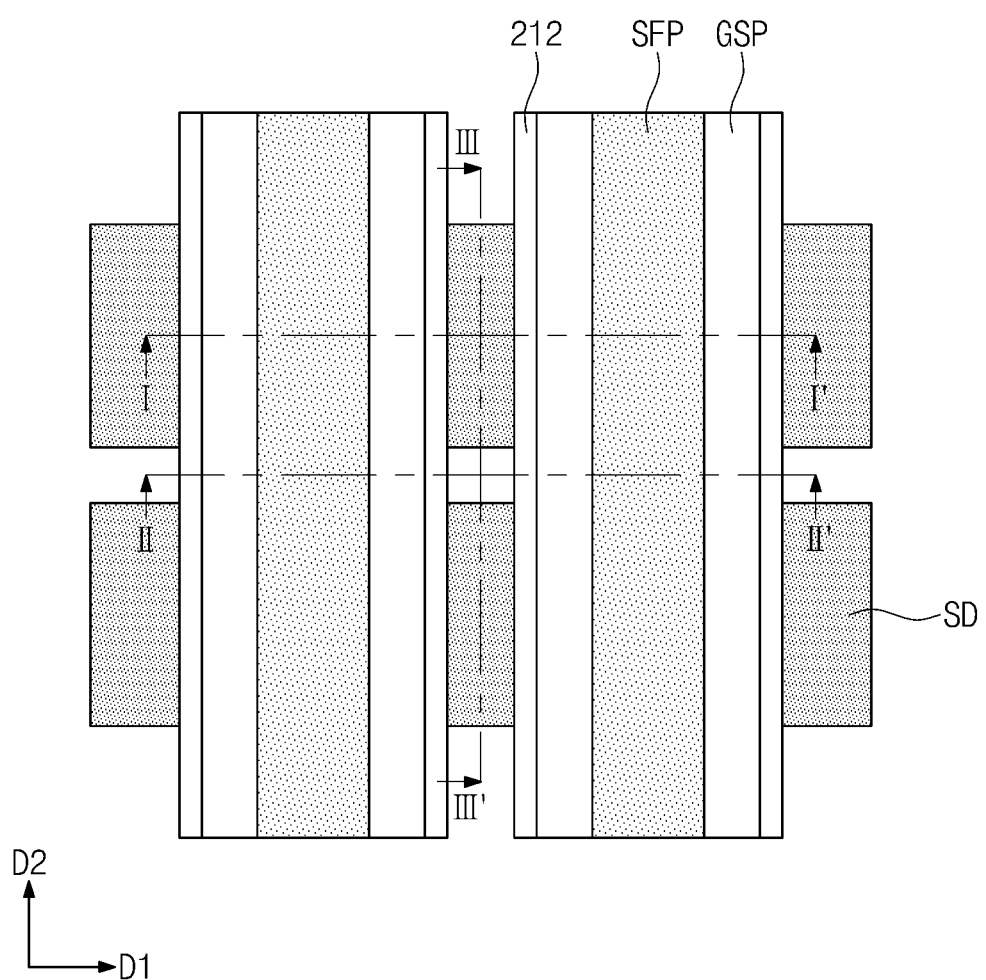
Figure 10B:
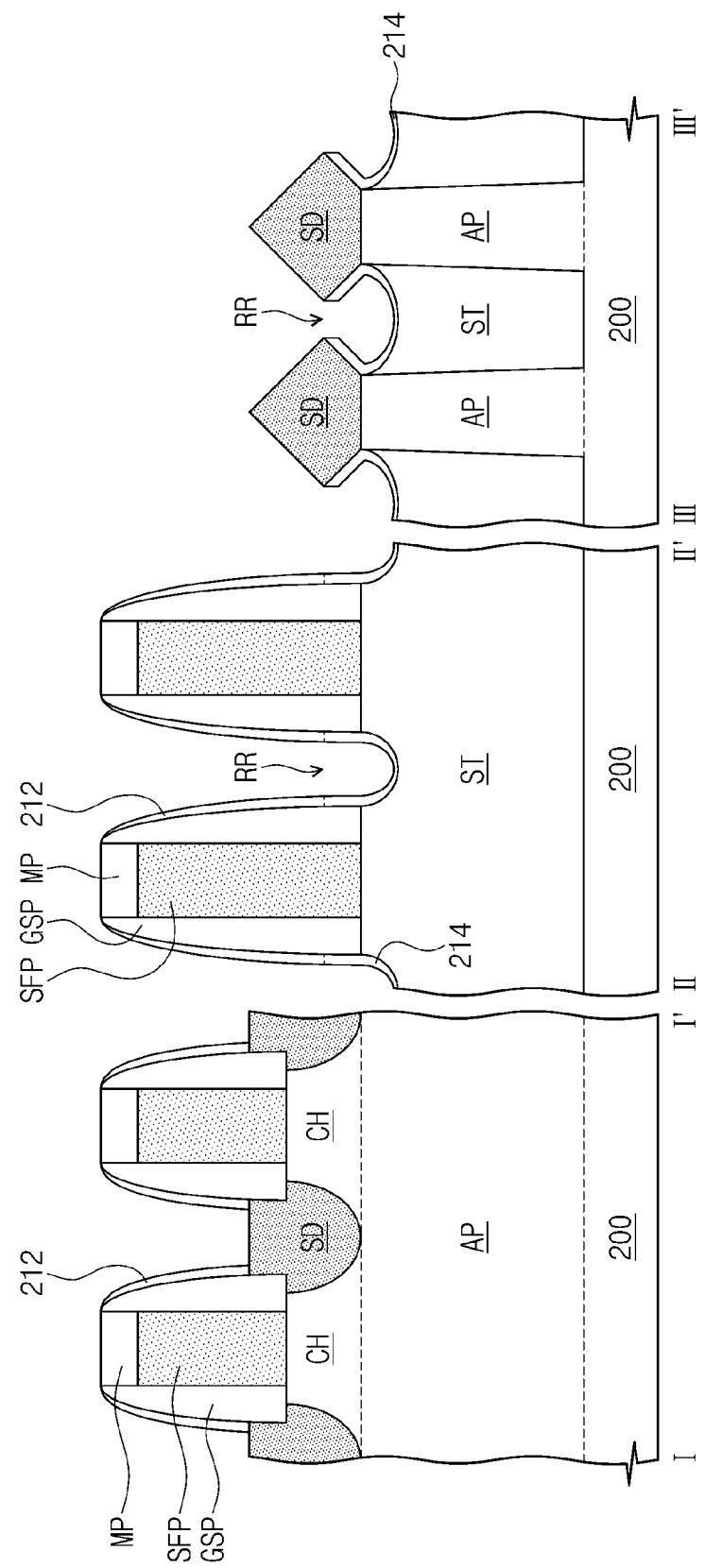

Referring to FIGS. 10A and 10B, injection prevention spacers 212 may be formed on the gate spacers GSP and an over-etch prevention layer 214 may be formed to cover an inner wall of the recess region RR. The injection prevention spacers 212 and the over-etch prevention layer 214 may be formed by anisotropically etching the injection prevention layer 210. The anisotropic etching may expose top surfaces of the mask patterns MP and top surfaces of the source/drain regions SD. The over-etch prevention layer 214 may be connected to a pair of adjacent injection prevention spacers 212. The over-etch prevention layer 214 may have a hydrophilic property higher than that of the source/drain regions SD.

Figure 11A:
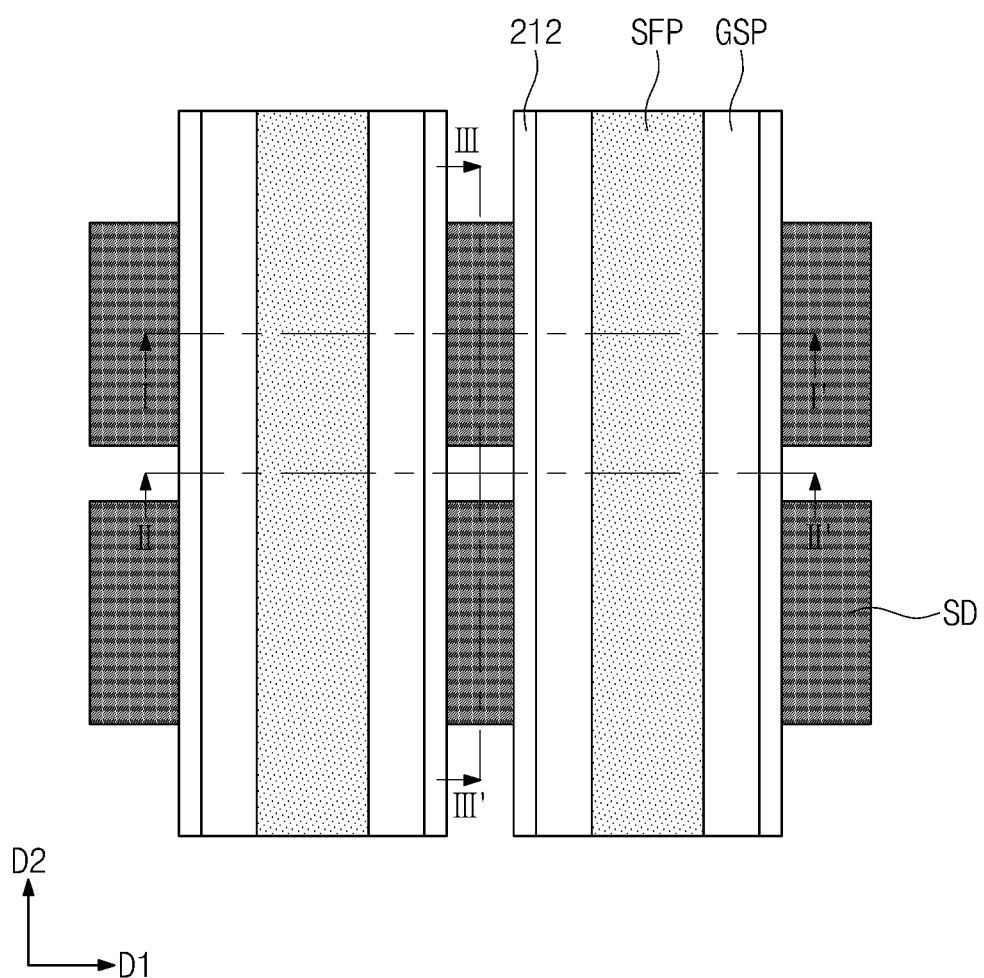
Figure 11B:
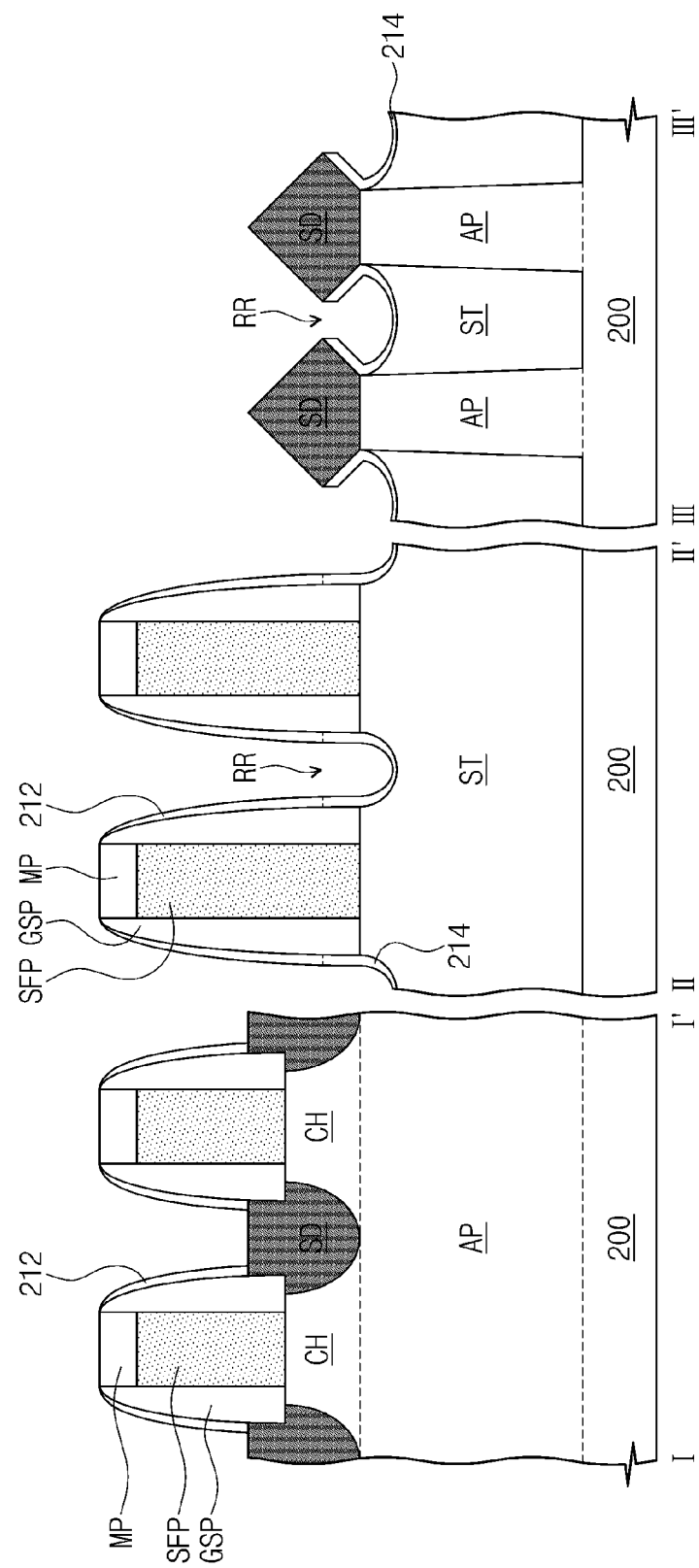

Referring to FIGS. 11A and 11B, an implant process may be performed to inject impurities into the source/drain regions SD. The impurities may be p-type or n-type impurities. In case that the source/drain regions SD exert the compressive strain on the channel region CH, the impurities may be p-type impurities. Alternatively, in case that the source/drain regions SD exert the tensile strain on the channel region CH, the impurities may be the n-type impurities. The injection prevention spacers 212 may serve as blocks which prevent the impurities from being injected into the channel region CH during the implant process.

Referring to FIGS. 12A-12B and 13A-13B in order, a clean-then-etch process may be performed to etch/remove the injection prevention spacers 212. The clean-then-etch process may be similar to the clean-then-etch process described with reference to FIGS. 2B and 2C.

Figure 12A:
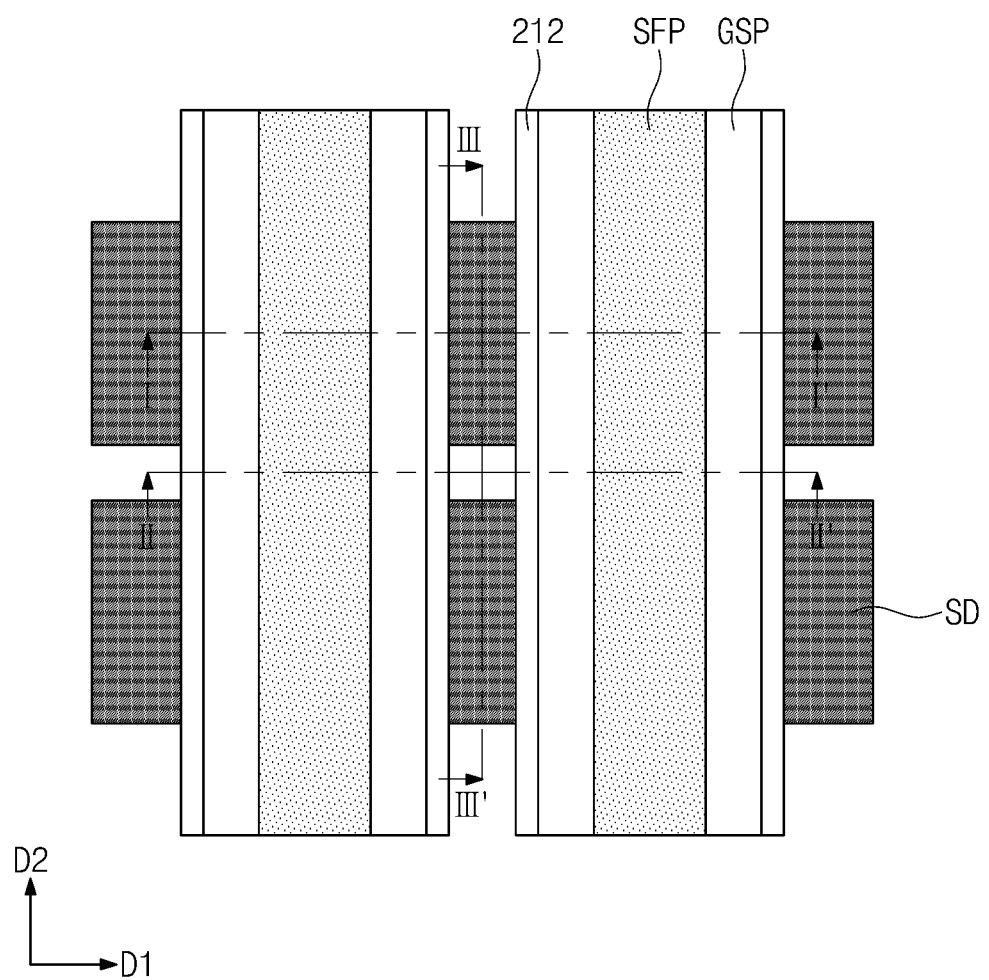
Figure 12B:
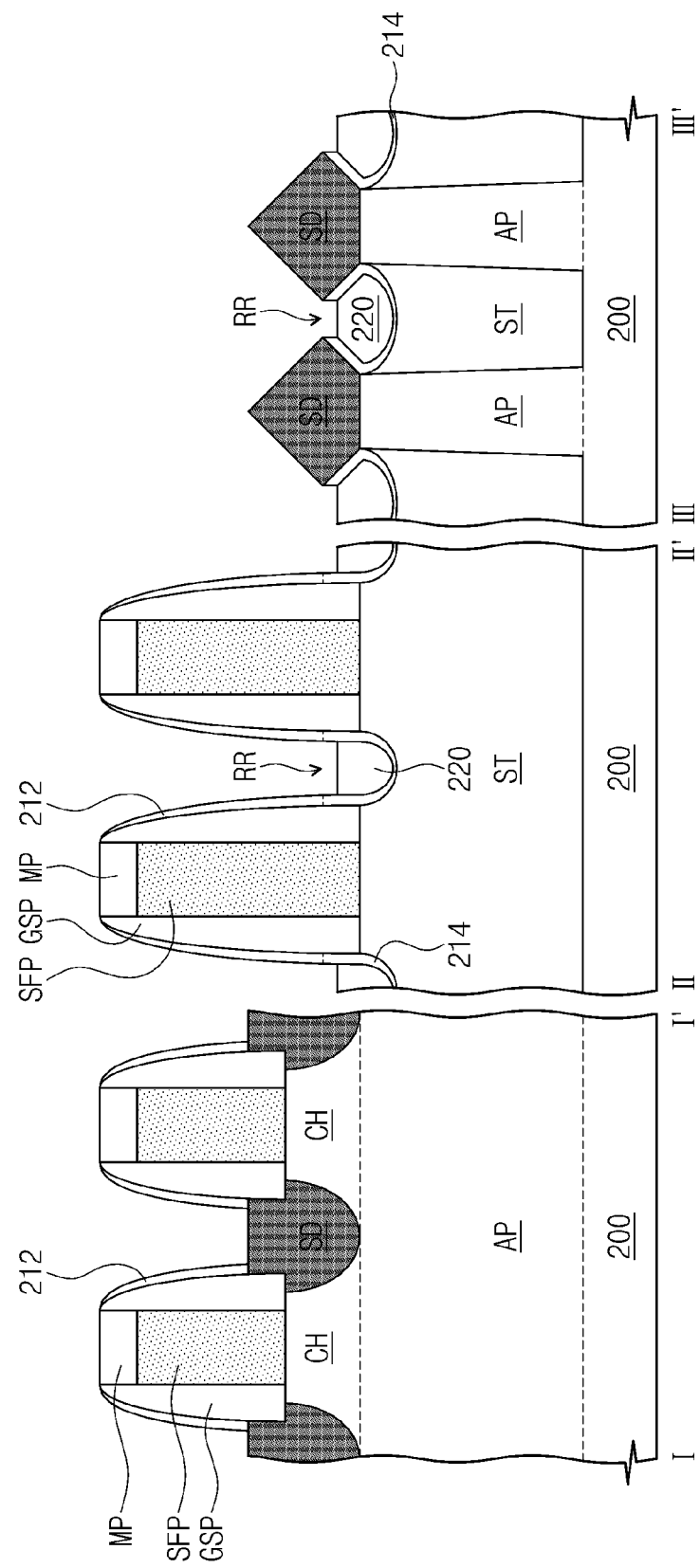

Referring to FIGS. 12A and 12B, a cleaning process may be performed. The cleaning process may include providing a cleaning solution onto the entire surface of the substrate 200. The cleaning solution may have a hydrophilic property, and may not substantially etch the source/drain regions SD, the injection prevention spacers 212, and the over-etch prevention layer 214. For example, the cleaning solution may be water ($H_2O$).

A portion 220 of the cleaning solution employed in the cleaning process may be introduced into the recess region RR such that the recess region RR may be at least partially filled with the cleaning solution 220. After the cleaning process, the cleaning solution provided outside the recess region RR may be removed. For example, a spin dry process may be performed to remove the cleaning solution outside the recess region RR. Since the mouth part RR_MP of the recess region RR may have a width narrower than that of the inner part RR_IP of the recess region RR, and/or the over-etch prevention layer 214 may have a hydrophilic property higher than that of the source/drain regions SD, the cleaning solution 220 may remain in the recess region RR. The cleaning process may be carried out for a long time enough to introduce the cleaning solution 220 into the recess region RR. For example, the cleaning process may be performed for a duration longer than that of a wet etch process described later with reference to FIGS. 13A and 13B.

Figure 13A:
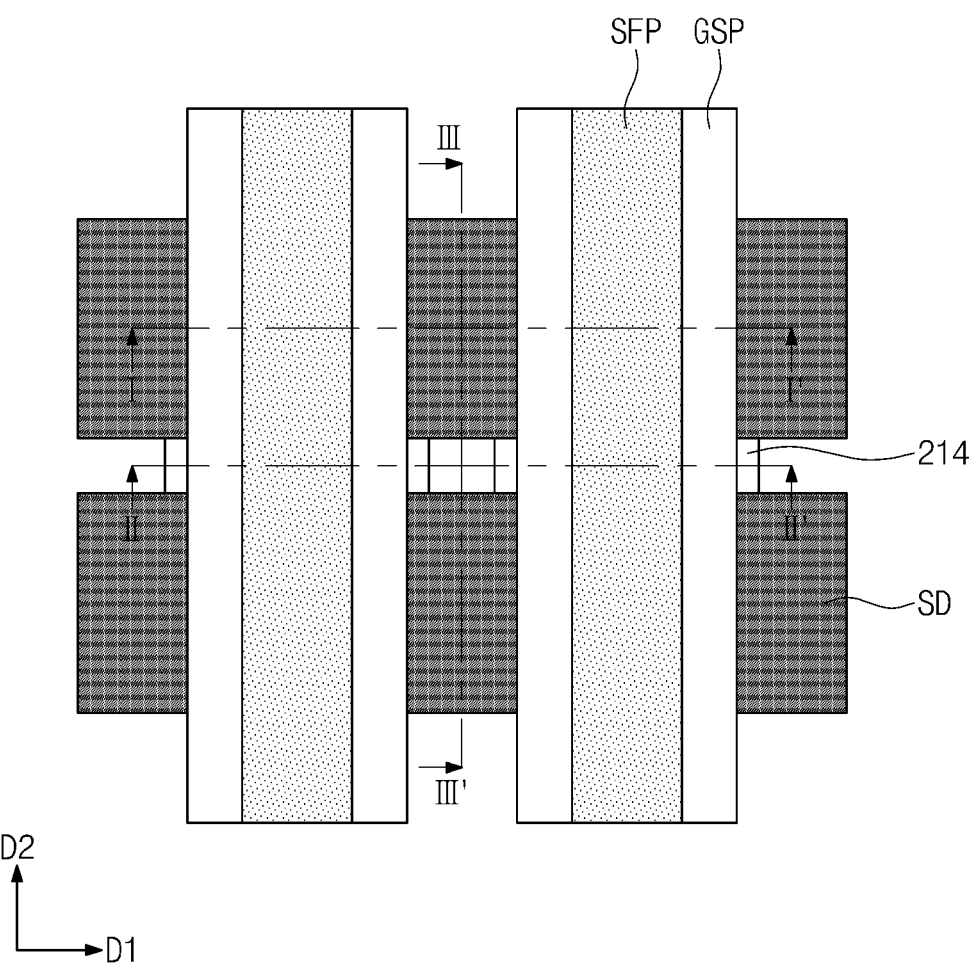
Figure 13B:
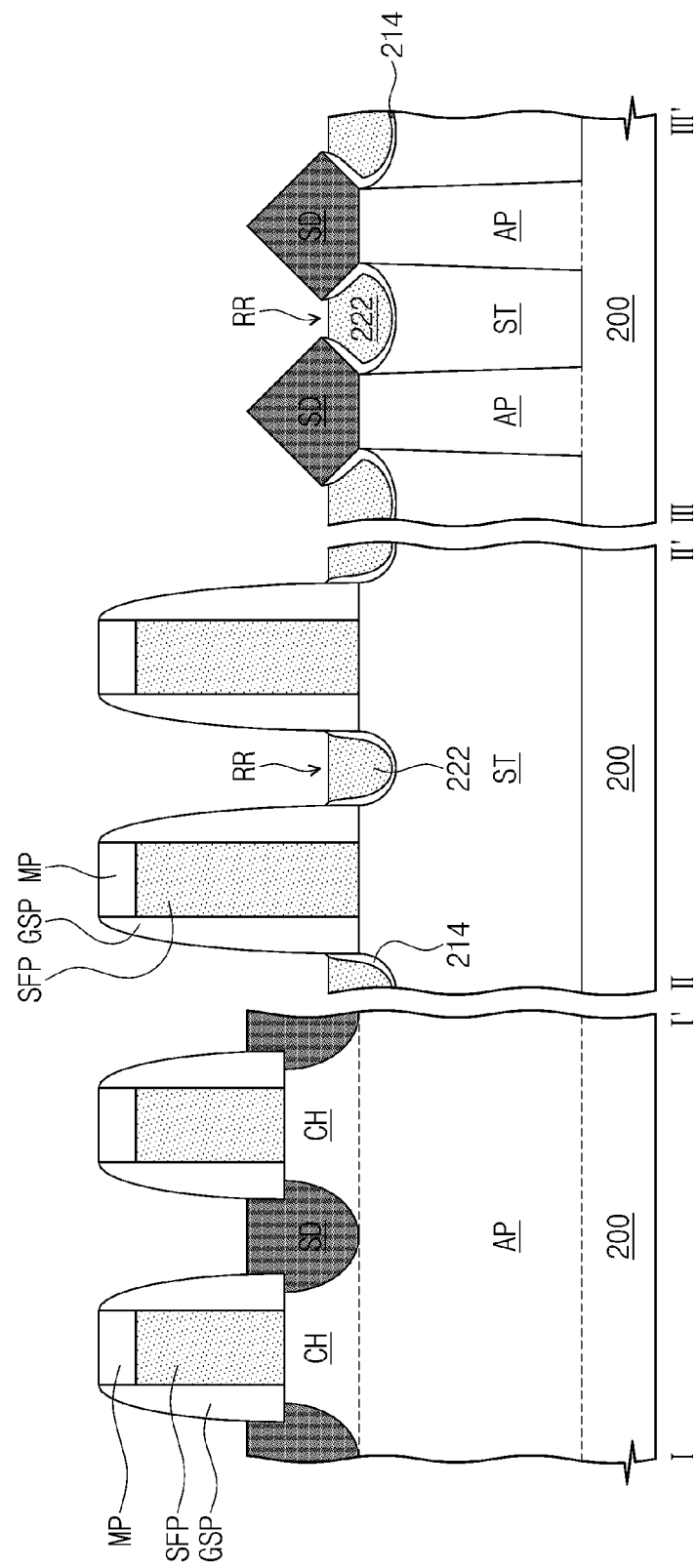

Referring to FIGS. 13A and 13B, a wet etch process may be performed to etch/remove the injection prevention spacers 212. The wet etch process may include providing an etching solution onto the entire surface of the substrate 200. The etching solution may exhibit a higher etch rate with respect to the injection prevention layer 212 than that of the source/drain regions SD. The etching solution may exhibit higher etch rate with respect to the over-etch prevention layer 214 than that of the source/drain regions SD. For example, the etching solution may include hydrofluoric acid and/or phosphoric acid.

During the wet etch process, a portion of the etching solution may be introduced into the recess region RR. The etching solution introduced into the recess region RR may be diluted by the cleaning solution 220 remained in the recess region RR. Therefore, the diluted etching solution 222 in the recess region RR may have a concentration less than that of the etching solution outside the recess region RR. The wet etch process may be performed for a duration shorter than that of the cleaning process described with reference to FIGS. 12A and 12B.

In some embodiments, the clean-then-etch process described above with reference to FIGS. 12A-12B and 13A-13B in order may be repeatedly carried out a plurality of times. In this case, subsequent clean-then-etch process may be similar to those described with reference to FIGS. 3A and 3B, and detailed descriptions thereof will therefore be omitted.

In some embodiments, unlike FIGS. 11A and 11B, the over-etch prevention layer 214 may be formed to block up the mouth part RR_MP of the recess region RR. In this case, prior to the clean-then-etch process, the over-etch prevention layer 214 may be partially etched/removed to open the mouth part RR_MP of the recess region RR. The partial removal of the over-etch prevention layer 214 may be obtained by processes substantially identical or similar to the processes described with reference to FIGS. 4, 5B and 5C, and detailed descriptions thereof will therefore be omitted.

The over-etch prevention layer 214 may be etched by the diluted etching solution 222 in the recess region RR.

In some embodiments, as illustrated in FIGS. 13A and 13B, the over-etch prevention layer 214 may remain in the recess region RR. Inasmuch as the diluted etching solution 222 may have a concentration less than that of the etching solution provided outside the recess region RR during the wet etch process, the over-etch prevention layer 214 may still remain in the recess region RR. In this case, the inner wall of the recess region RR may not be etched.

In other embodiments, unlike FIGS. 13A and 13B, the over-etch prevention layer 214 may be removed. In this case, the inner wall of the recess region RR may be etched and/or deformed. However, since the diluted etching solution 222 in the recess region RR may have a concentration less than that of the etching solution provided outside the recess region RR during the wet etch process, the etching degree/deformation of the inner wall of the recess region RR may be insignificant.

Figure 14A:
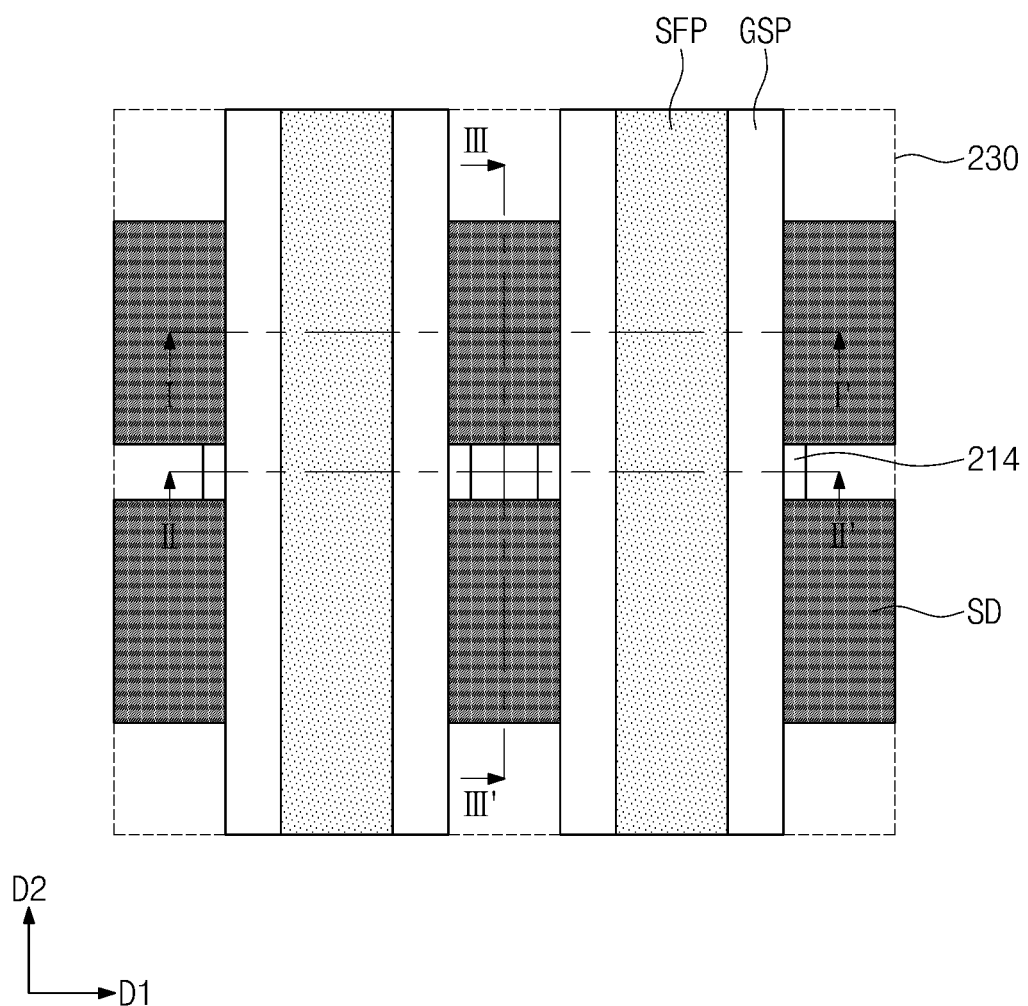
Figure 14B:
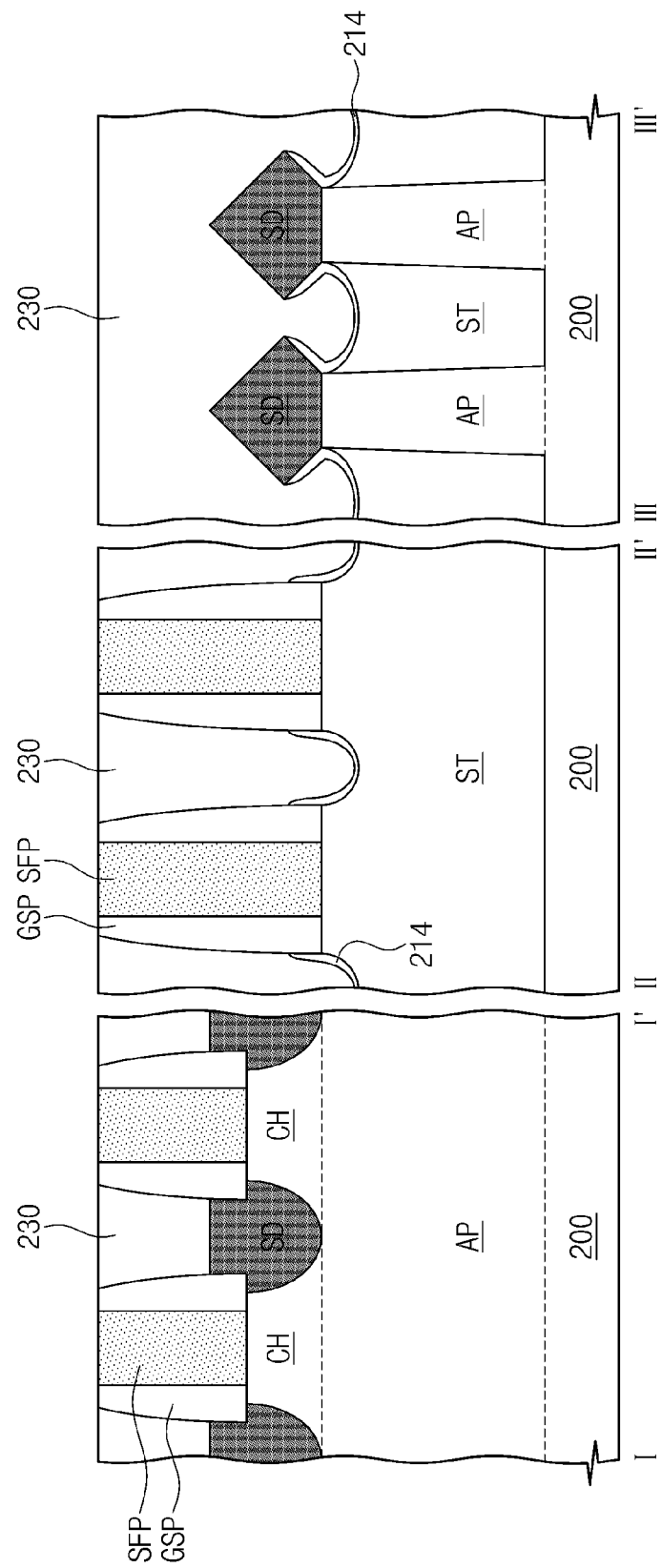

Referring to FIGS. 14A and 14B, a heat treatment may be performed to remove the diluted etching solution 222 from the recess region RR.

An interlayer dielectric layer 230 may be formed to cover the recess region RR and the source/drain regions SD. The formation of the interlayer dielectric layer 230 may include forming an insulation layer to cover the entire surface of the substrate 200 and planarizing the insulation layer until top surfaces of the sacrificial patterns SFP are exposed. For example, the insulation layer may include silicon oxide and may be formed by a chemical vapor deposition (CVD) process. For example, the planarization of the insulation layer may be executed using an etch back process or a chemical mechanical polishing (CMP) process.

Figure 15A:
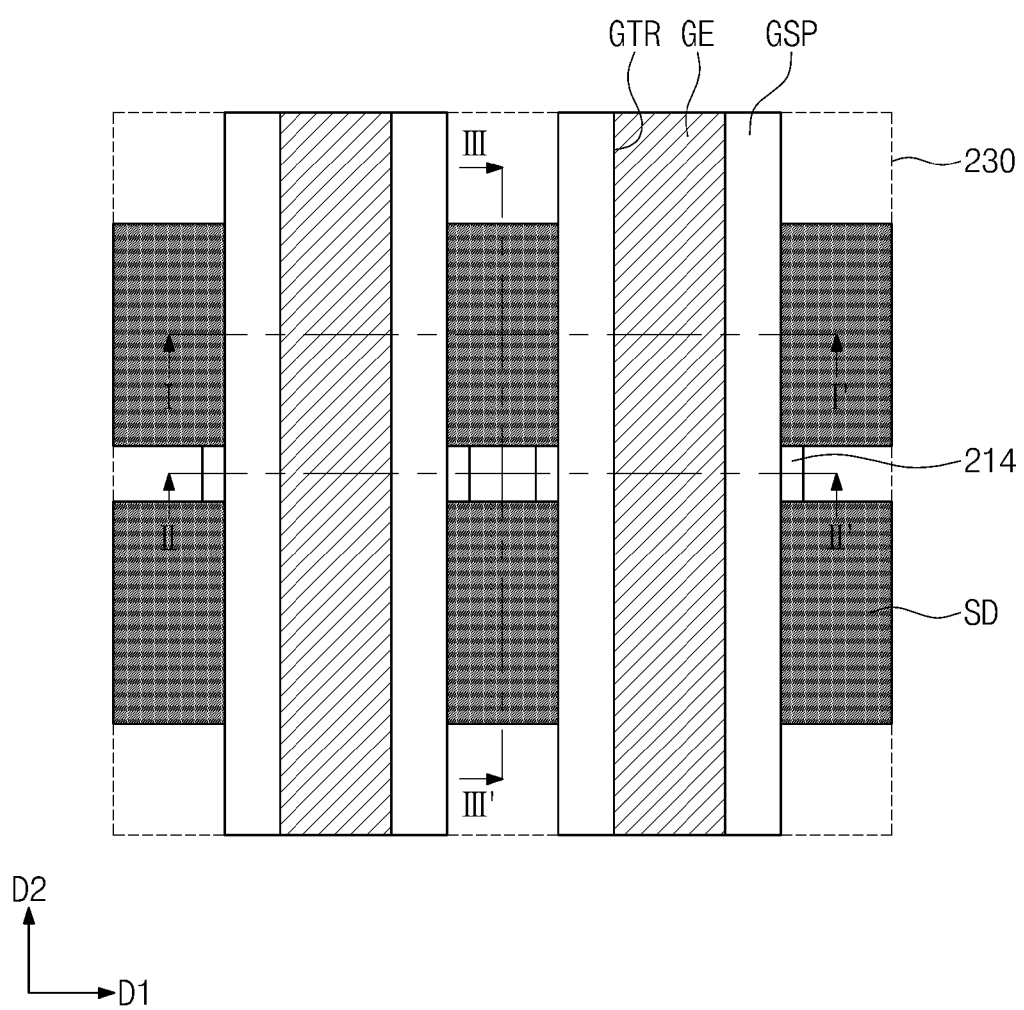
Figure 15B:
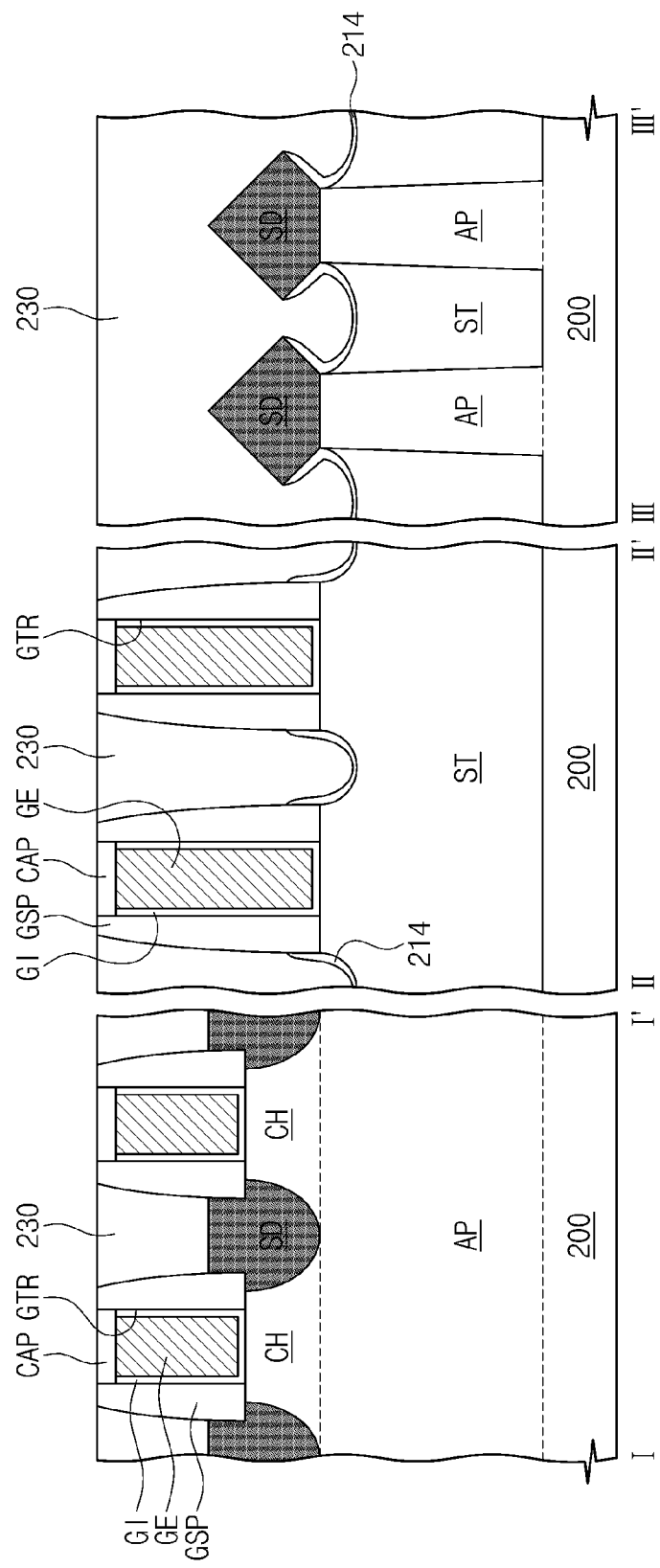

Referring to FIGS. 15A and 15B, the sacrificial patterns SFP may be replaced by gate structures. Each of the gate structures may include a gate insulation pattern (GI), a gate electrode (GE), and a capping pattern (CAP).

The sacrificial patterns SFP may be selectively removed to form gate trenches GTR. The channel regions CH may be exposed through the gate trenches GTR.

A gate insulation layer (not shown) may be formed in each of the gate trenches GTR. The gate insulation layer may be conformally formed and may not completely fill the gate trenches GTR. The gate insulation layer may be formed by, for example, an atomic layer deposition (ALD) process. The gate insulation layer may include, for example, silicon oxide, silicon oxynitride, and/or a high-k material of which dielectric constant is greater than that of silicon oxide.

A gate electrode layer (not shown) may be formed to fill the gate trenches GTR on the gate insulation layer. The gate electrode layer may include, for example, at least one of doped semiconductor, metal, and conductive metal nitride. The gate electrode layer may be formed by a deposition process such as a chemical vapor deposition process or a sputtering process.

The gate electrode layer and the gate insulation layer may be planarized until a top surface of the interlayer dielectric layer 230 is revealed. As a result, the gate insulation pattern GI and the gate electrode GE may be locally formed in each of the gate trenches GTR. The planarization of the gate electrode layer and the gate insulation layer may be executed by, for example, a chemical mechanical polishing (CMP) process.

Upper portions of the gate electrodes GE may be recessed, and the capping patterns CAP may be formed on the gate electrodes GE. For example, an etch process may be performed to selectively remove the upper portions of the gate electrodes GE. Through the etch process, top surfaces of the gate electrodes GE may be lowered than top surfaces of the interlayer dielectric layer 230. In some embodiments, after the upper portions of the gate electrodes GE are recessed, an etch process may be performed to remove a portion of the gate insulation pattern GE having a level higher than that of a recessed top surface of the gate electrode GE. The capping patterns CAP may be formed to cover the recessed top surfaces of the gate electrodes GE. The capping patterns CAP may completely fill recess regions of the gate electrodes GE. The capping patterns CAP may include, for example, at least one of silicon oxide, silicon nitride, silicon oxynitride, silicon carbon nitride (SiCN), and silicon oxynitride (SiCON).

In some embodiments, the injection prevention spacers 212 may be removed by the clean-then-etch process. According to the clean-then-etch process, the cleaning process may be performed prior to the wet etch process such that the cleaning solution 220 may at least partially fill the recess region RR. For example, the cleaning solution 220 may remain in the recess region RR after the cleaning process and/or during the subsequent wet etch process. Therefore, even though the etching solution is partially introduced into the recess region RR during the subsequent wet etch process, the etching solution 222 in the recess region RR may have a concentration less than that of the etching solution provided outside the recess region RR during the wet etch process. Consequently, the wet etch process may remove the injection prevention layer 212 while preventing or reducing etching and/or deforming of the inner wall of the recess region RR.

In case that the inner wall of the recess region RR is excessively etched by the wet etch process for removing the injection prevention layer 212, the gate spacers GSP adjacent to the recess region RR may be thinned such that the leakage current may be increased. For example, owing to the excessive etch on the inner wall of the recess region RR, the recess region RR and the gate trenches GTR may be connected to induce the electrical short between the source/drain regions SD and the gate electrodes GE. However, according to embodiments of the inventive concepts, the afore-mentioned problems may be improved because the injection prevention spacers 212 may be etched while preventing or reducing the excessive etch on the inner wall of the recess region RR. As a result, reliability of semiconductor device may be improved.

Although aspects of embodiments of the present invention has been described in connection with the accompanying drawings illustrating embodiments of the present invention, it is not limited thereto. It will be apparent to those skilled in the art that various substitution, modifications and changes may be implemented thereto without departing from the scope and spirit of the invention.

What is claimed is:

1. A method of manufacturing a semiconductor device, the method comprising:
   providing a first structure comprising a recess region on a substrate, the recess region including an inner part and a mouth part whose width is less than that of the inner part in a cross-sectional view; and
   performing a clean-then-etch process to remove at least a portion of etching object formed outside the recess region, the performing the clean-then-etch process comprising:
      performing a cleaning process filling at least a portion of the recess region with a cleaning solution; and
      performing a wet etch process to the substrate in a state that the cleaning solution remains in the recess region.

2. The method of claim 1, wherein the inner part of the recess region includes an inner wall having a hydrophilic property higher than that of an outer surface of the first structure, the outer surface of the first structure being connected to the mouth part of the recess region.

3. The method of claim 2, wherein the cleaning solution has a hydrophilic property.

4. The method of claim 1, wherein the cleaning process is carried out for a duration longer than a duration of the wet etch process.

5. The method of claim 1, wherein the removing at least a portion of etching object comprises performing the clean-then-etch process a plurality of times.

6. The method of claim 1, wherein providing the first structure comprises:
   forming first and second active patterns on the substrate, the first and second active patterns extending parallel to each other in a first direction;
   forming first and second gate structures on the substrate, the first and second gate structures extending parallel to each other in a second direction crossing the first direction;
   forming first and second source/drain regions on the respective first and second active patterns, and between the first and second gate structures; and
   forming a first insulation layer on the substrate covering the first and second active patterns, the first and second gate structures, and the first and second source/drain regions,
   wherein the recess region is formed between the first and second active patterns.

7. The method of claim 1, wherein the performing the wet etch process comprises providing an etching solution to the substrate, a portion of the etching solution being introduced into the recess region during the wet etch process,
   wherein the cleaning solution in the recess region dilutes the portion of the etching solution introduced into the recess region.

8. The method of claim 1, after removing the at least a portion of etching object, further comprising performing a heat treatment to remove the cleaning solution from the recess region.

9. The method of claim 1, wherein
   the first structure comprises a first layer and a second layer on the first layer,
   the recess region penetrates through the second layer to extend toward the first layer, and
   the wet etch process uses an etching solution having a greater etch rate with respect to the first layer than an etch rate of the second layer.

10. A method of manufacturing a semiconductor device, the method comprising:
    forming a device isolation layer on a substrate, the device isolation layer defining first and second active patterns that extend parallel to each other in a first direction;
    forming a pair of sacrificial patterns crossing the first and second active patterns;
    forming first and second source/drain regions respectively in the first and second active patterns exposed between the sacrificial patterns;
    forming injection prevention spacers on sidewalls of the sacrificial patterns; and
    removing the injection prevention spacers using a clean-then-etch process,
    wherein a recess region is defined by a top surface of the device isolation layer, facing sidewalls of the sacrificial patterns and facing sidewalls of the first and second source/drain regions,
    wherein the clean-then-etch process comprises:
    performing a cleaning process filling at least a portion of the recess region with a cleaning solution; and
    performing a wet etch process to the substrate in a state that the cleaning solution remains in the recess region.

11. The method of claim 10, wherein the forming first and second source/drain regions comprises performing a selective epitaxial growth process using the exposed first and second active patterns as seed layers,
    wherein the facing sidewalls of the first and second source/drain regions comprise lower sidewalls that are inclined so as to approach with increasing distance from the substrate and upper sidewalls that are inclined away from each other with increasing distance from the substrate,
    wherein the recess region includes a mouth part defined by the lower sidewalls.

12. The method of claim 10, wherein the forming injection prevention spacers comprises:
    forming an injection prevention layer that covers an entire surface of the substrate having the first and second active patterns, the sacrificial patterns, and the first and second source/drain regions formed thereon; and
anisotropically etching the injection prevention layer,
wherein an over-etch prevention layer is formed on an inner wall of the recess region by the forming injection prevention spacers.

13. The method of claim 12, wherein the over-etch prevention layer has a hydrophilic property higher than that of the first and second source/drain regions.

14. The method of claim 12, wherein the cleaning solution has a hydrophilic property.

15. The method of claim 10, wherein the cleaning process is carried out for a duration longer than a duration of the wet etch process.

16. A method of manufacturing a semiconductor device, the method comprising:
providing a substrate;
forming first and second active patterns on the substrate, the first and second active patterns extending parallel to each other in a first direction;
forming first and second gate structures on the substrate, the first and second gate structures extending parallel to each other in a second direction crossing the first direction;
forming first and second source/drain regions on the respective first and second active patterns, and between the first and second gate structures;
forming a first insulation layer on the substrate covering the first and second active patterns, the first and second gate structures, and the first and second source/drain regions;
cleaning the substrate with a cleaning liquid; and
etching the first insulation layer with an etching solution in a state that a portion of the cleaning liquid remains between the first and second source/drain regions.

17. The method of claim 16, wherein a recess region is formed between the first and second source/drain regions, and
wherein the portion of the cleaning liquid remains in the recess region during the etching the first insulation layer.

18. The method of claim 17, wherein the recess region is disposed between the first and second gate structures.

19. The method of claim 18, further comprising:
forming a device isolation layer between the first and second active patterns,
wherein the recess region is formed on the device isolation layer.

20. The method of claim 16, wherein the cleaning the substrate with a cleaning liquid and the etching the first insulation layer are performed a plurality of times in this order.

* * * * *